(12) United States Patent
Kouzuma

(10) Patent No.: US 6,747,374 B2
(45) Date of Patent: Jun. 8, 2004

(54) CIRCUIT FOR CORRECTING DEVIATION IN OSCILLATING FREQUENCY

(75) Inventor: Shinichi Kouzuma, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/369,537

(22) Filed: Feb. 21, 2003

(65) Prior Publication Data

US 2004/0012415 A1 Jan. 22, 2004

(30) Foreign Application Priority Data

Jul. 19, 2002 (JP) ........................................ 2002-211027

(51) Int. Cl.[7] .............................................. H03B 21/00
(52) U.S. Cl. ........................................ 307/106; 327/107
(58) Field of Search ................................. 327/106, 107, 327/147, 291, 299

(56) References Cited

U.S. PATENT DOCUMENTS 4,155,218 A * 5/1979 Wiget ........................... 368/69
4,456,386 A * 6/1984 Dellea ........................ 368/201
6,359,476 B2 * 3/2002 Hartman et al. ............ 327/106

FOREIGN PATENT DOCUMENTS

| JP | 5-152938 | 6/1983 |
| JP | 9-311190 | 12/1997 |
| JP | 11-183660 | 7/1999 |

* cited by examiner

Primary Examiner—Dinh T. Le
(74) Attorney, Agent, or Firm—Rabin & Berdo, P.C.

(57) ABSTRACT

A frequency correction circuit for accurately correcting clock signals of an oscillating frequency with a simplified configuration without adjusting an oscillator circuit generating the oscillating frequency. A count adjuster of a time-base counter (TBC) receives a delay control signal and a clock signal. The count adjuster includes an inverter and an AND gate. The inverter is responsive to the delay control signal and develops an output signal, while the AND gate receives the clock signal. During the high level period of the delay control signal, the AND gate sends out the clock signal, from which one clock has been erased, as a clock signal of the initial stage T-type flip-flop of a clock frequency divider, which then produces an output signal, from which deviations have been removed.

29 Claims, 16 Drawing Sheets

CIRCUIT FOR CORRECTING DEVIATION IN OSCILLATING FREQUENCY

FIELD OF THE INVENTION

The present invention relates to a frequency corrector circuit for correcting deviations in frequency generated by, for example, an oscillator circuit to adjust the frequency.

DESCRIPTION OF BACKGROUND ART

An LSI (Large-Scale Integration) circuitry may in general include a frequency generator comprising a quartz oscillator, a trimmer capacitor and another capacitor. In the frequency generator, the quartz oscillator is provided between the input and output ports of the LSI circuitry. The input port to the LSI circuitry is connected to one terminal of the quartz oscillator and one plate of the trimmer capacitor. The output port to the LSI circuitry is connected to the other port of the quartz oscillator and one plate of the other capacitor. The trimmer capacitor and the other capacitor have the other ends thereof connected in common to ground.

This circuit configuration is used as timepiece in, for example, a microcomputer. For the microcomputer, a quartz oscillator is used for generating for example 32.768 kHz. This frequency is divided by a frequency divider into a waveform of 1 kHz for use in displaying the second hand or the like of the timepiece. For the frequency divider, fifteen T-type flip-flops are used. Each of the flip-flops is adapted to supply its Q output as clock signals to the successive stage of flip-flop for frequency division to ultimately form 1 Hz frequency.

Meanwhile, the quartz oscillator used is subjected to frequency variations or inaccuracy in the order of ±30 ppm as manufacture tolerance. The trimmer capacitor is adapted to vary its capacitance for correcting the variations for adjusting the frequency. However, the trimmer capacitor is more expensive than routine capacitors. Moreover, in employing trimmer capacitors, frequency adjustment is required in the manufacture process. Even if the frequency is adjusted, frequency deviation or fluctuation occurs due to an ambient temperature, which may often be different from one when adjusting the oscillator circuit.

Japanese Laid-Open Patent Publication No. 152938/1993 discloses a data processor comprising a counter capable of varying its count with a programmed number, a ring counter generating its counter output as clock pulses, and a coincidence circuit for comparing the count from the ring counter with a preset value. The programmed number in the counter is changeable in response to the output from the coincidence circuit. The programmed number is an integer obtained on dividing clock frequency with a target frequency and then dividing the resulting value with the maximum count of the ring counter. Since this counter operates in response to a pre-fixed clock frequency, it is not possible to cope with frequency deviations caused from time to time by temperature changes or lapse of time.

Japanese Laid-Open Patent Publication No. 311190/1997 teaches a timepiece unit having an automatic error correcting function, in which timing errors are automatically corrected in order to cope with the lead and lag of the fundamental pulses. This timepiece unit includes a quartz oscillator, a fundamental pulse oscillator circuit, a correction value input circuit and a pulse corrector for increasing or decreasing the fundamental pulses based on errors in the fundamental pulses to correct the errors. The fundamental pulse oscillator circuit generates fundamental pulses with a period of one second.

The pulse corrector includes a correction value operating unit, a correction pulse generator and a modulator to increase or decrease the fundamental pulses of 1 Hz. This timepiece unit corrects the frequency-divided output. The timepiece unit may be used with advantage to accurately correct the time indicated by a timepiece circuit, or real time clock (RTC).

However, since the RTC circuit is not adapted to accurately correct the clock signals for RTC per se, the RTC circuit still suffers from errors. Thus, Japanese Laid-Open Patent Publication No. 183660/1999 teaches a portable information processing apparatus with a timepiece built-in adapted for setting precisely the clock signals for RTC to correct values to decrease processing volume for RTC time corrections. The portable information processing apparatus disclosed in the Japanese publication includes an oscillator for RTC 21, a comparator 25 and a memory 12 to provide for a stable frequency of the clock signals readily to improve the reliability of the information processing functions of the apparatus applied.

However, with these techniques, the components used are expensive, while it is still required to perform frequency correction during the manufacturing process. Moreover, if the frequency is corrected, it is not possible to follow up with frequency variations brought about by environmental changes.

SUMMARY OF THE INVENTION

It is an object of the present invention to provide a frequency corrector circuit with a simplified configuration for accurately correcting the clock signals of the oscillating frequency without adjusting the oscillator circuit.

In accordance with the present invention, a frequency correction circuit for correcting a deviation in frequency of a signal generated from a clock signal obtained from an oscillator circuit, which comprises an oscillator device for generating a reference clock signal, and first and second capacitive elements, each of which has one end connected across the oscillator device and another end grounded, comprises a clock frequency divider for frequency-dividing the clock signal into a desired frequency. The clock frequency divider comprises a plurality of counters connected in cascade, each of which frequency-divides the clock signal and supplies a frequency-divided output to successive one of the plurality of counters as a clock, and a correction controller for controlling the clock frequency divider. The clock frequency divider further comprises a count adjuster for adjusting timing of counting carried out in response to the clock signal to cancel an error contained in the clock signal. The correction controller comprises a time setting circuit for setting of first and second reference times and initializing the clock frequency divider, a time generator for calculating a generation time corresponding to a sum of the first reference time supplied from the time setting circuit and a time from the clock frequency divider, a time comparator for comparing the generation time with the second reference time, and a count controller operative in response to the time comparator for supplying the count adjuster with a control signal controlling the plurality of counters to delaying or hastening a timing of counting.

With the frequency correction circuit of the present invention, the timing is calculated by the time generator in the correction controller by summing a first reference time supplied from the time setting circuit to the time supplied from the clock frequency divider. The generation time is compared by the time comparator circuit to the second reference time and, based on the result of the comparison, the count adjuster is controlled by the count controller to adjust the timing to cancel an error contained in the clock signals to enable the desired frequency to be output from the frequency divider.

Thus, it is possible to produce a desired frequency form the clock frequency divider with deviations corrected. Since no costly trimmer capacitor is needed in the oscillator circuit, but addition of a simplified circuit suffices, it is possible to suppress the cost.

BRIEF DESCRIPTION OF THE DRAWINGS

The objects and features of the present invention will become more apparent from consideration of the following detailed description taken in conjunction with the accompanying drawings in which.

DESCRIPTION OF THE PREFERRED EMBODIMENTS

Figure 1:
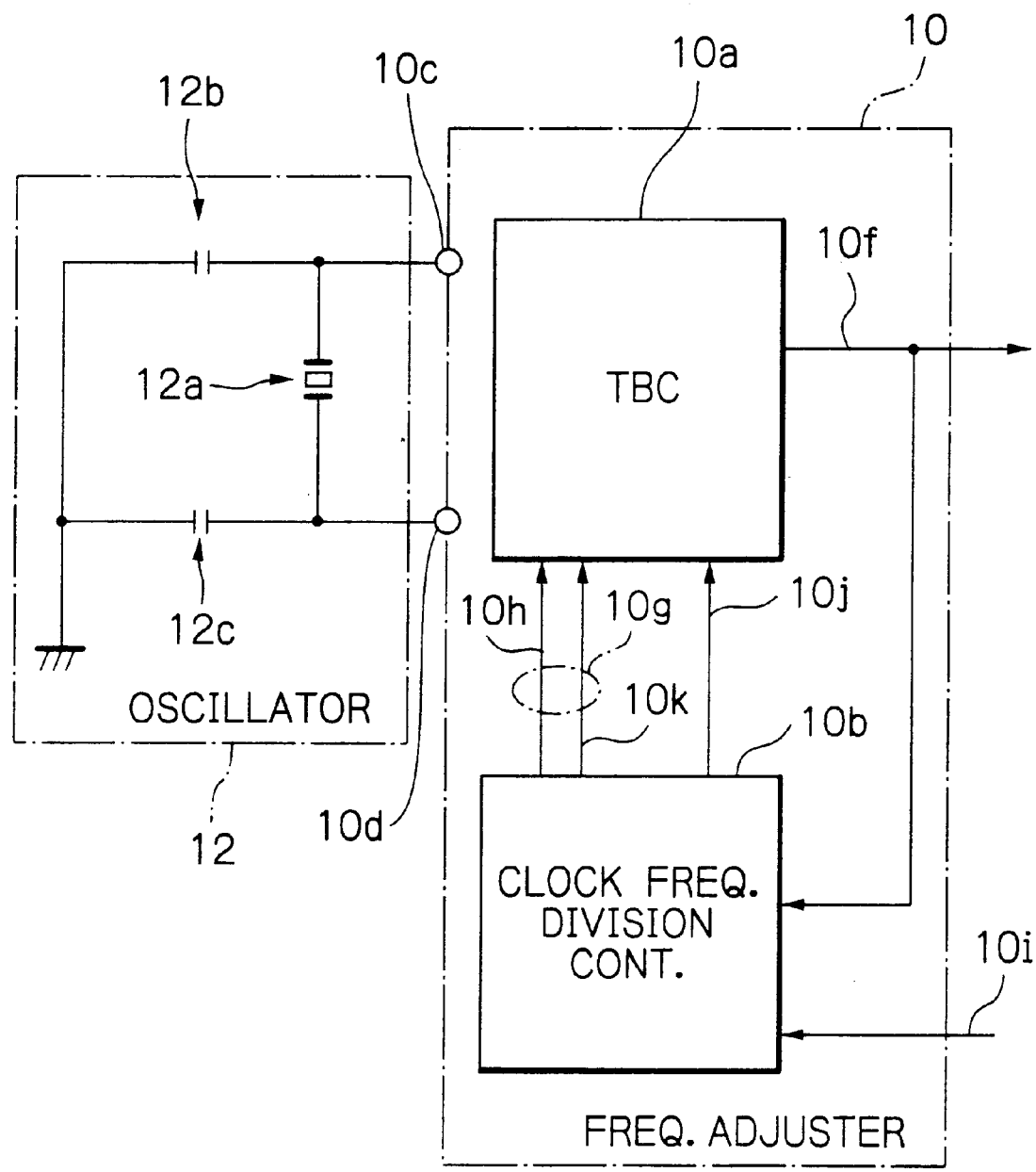
FIG. 1 is a schematic block diagram showing an embodiment of a frequency adjuster to which a frequency corrector circuit of the present invention is applied together with an oscillator.

Referring to the drawings, preferred embodiments of the present invention will be described in detail. The illustrative embodiment includes a frequency adjuster 10, to which the frequency correction circuit of the present invention is applied. The portions of the frequency adjuster 10 not directly relevant to understanding the present invention are neither shown nor described in detail. In the following description, signals are designated by the reference numerals of connection lines on which the signals appear.

Referring to FIG. 1, the embodiment of the frequency adjuster 10 is designed in the form of an LSI (Large-Scale Integration) circuitry, and includes a time-base counter (TBC) 10*a* and a clock frequency division controller 10*b*. To the frequency adjuster 10, an oscillator circuit 12 is connected as shown. The oscillator circuit 12 includes a quartz oscillator 12*a* and capacitors 12*b* and 12*c* interconnected as illustrated. In the instant embodiment, the quartz oscillator 12*a* is subjected to variations or fluctuations in the order of ±30 ppm with respect to 32.768 kHz, and may be used as, for example, a timepiece for a microcomputer. The capacitor 12*b*, connected to an input terminal 10*c* of the frequency adjuster 10, may be a trimmer capacitor that has its capacitance changeable such as to compensate for variations in the oscillating frequency. The capacitor 12*c* is connected to an output terminal 10*d* of the frequency adjuster 10. The capacitors 12*b* and 12*c* have the opposite electrodes or plates thereof grounded to form a π-type of oscillator circuit.

The time-base counter 10*a* is adapted to divide the frequency of clock signals CLK, which are initially generated from the oscillator circuit 12, and output an output signal 10*f* of 1 Hz as a desired frequency for a utility circuit, such as a microcomputer, which may be interconnected to the connection 10*f*. The output signal is also supplied to a clock frequency division controller 10*b*.

Figure 2:
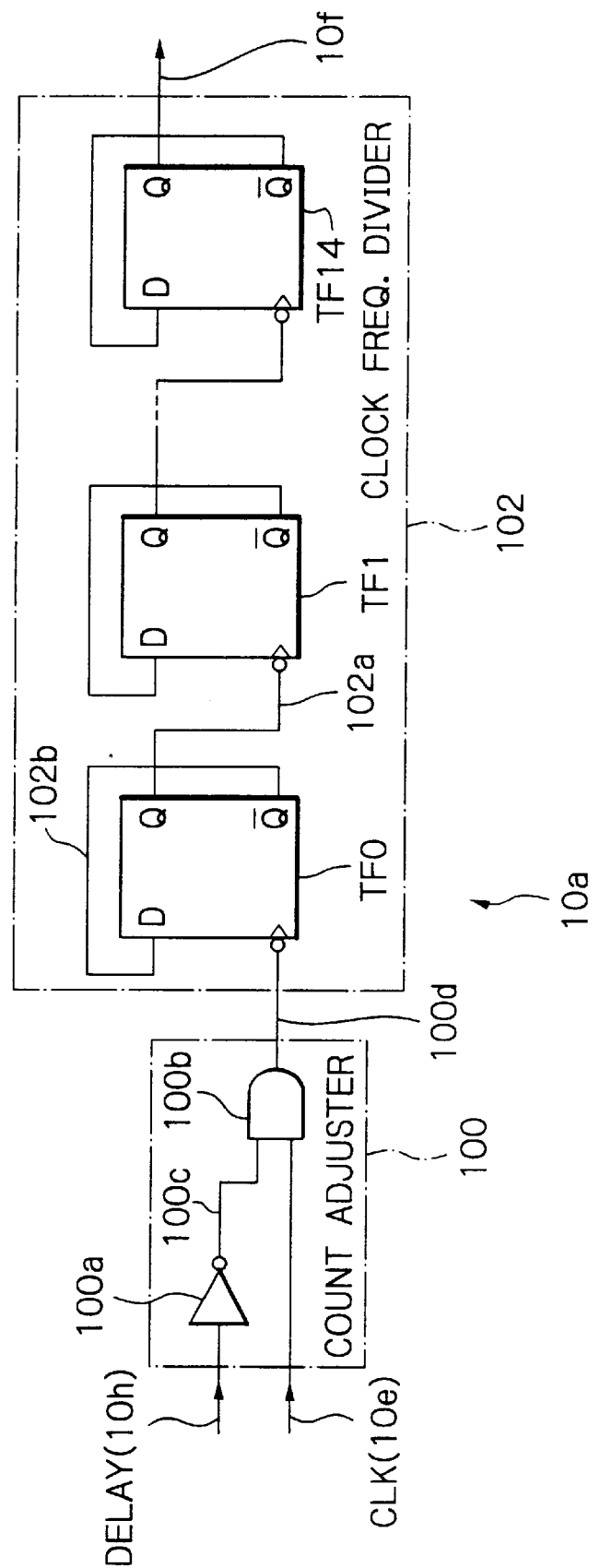
FIG. 2 is a circuit diagram schematically showing the configuration of a time-base counter included in the embodiment shown in FIG. 1.

The configuration of the time-base counter 10*a* is further described. The time-base counter 10*a* includes a count adjuster 100 and a clock frequency divider 102 interconnected as shown in FIG. 2. The count adjuster 100 functions as cancellation means for canceling one clock of the clock signals CLK supplied, and includes an inverter 100*a* and a two-input logical product (AND) gate 100*b*. In the control signal 10*g* from the clock frequency division controller 10*b*, shown in FIG. 1, a delay control signal DELAY (10*h*) is supplied to the inverter 100*a*. The inverter 100*a* outputs a level-inverted signal 100*c* of the delay control signal DELAY to one input port of the AND gate 100*b*. To the other input port of the AND gate 100*b* are supplied clock signals CLK. The count adjuster 100 outputs an output signal 100*d* of the AND gate 100*b* to the clock frequency divider 102.

The clock frequency divider 102 includes fifteen T-type flip-flops TF0 through TF14, each of which has its Q output terminal connected in cascade to a clock input terminal of the T-type flip-flop following thereto, as shown in FIG. 2. The T-type flip-flops do not have a data input, but, in the present embodiment, the Q-bar terminal thereof connected to its own data input terminal D so as to produce outputs from the Q and Q-bar output terminals in response to the negative-going edge of the clock signals CLK. The Q output of each of the flip-flops TF0-TF13, not shown, except the last one TF14 is connected to the clock input terminal of the T-type flip-flop following thereto. The T-type flip-flop TF0 sends out an output signal 102*a* as a clock signal for the T-type flip-flop TF1. The Q-bar output terminal outputs a signal 102*b* corresponding to a signal inverted in level from the output signal 102*a* of the Q output terminal. The clock frequency divider 102 has a series of the above-described basic connections in cascade to lower the frequency.

To the clock input terminal of the first stage T-type flip-flop TF0 is supplied an output adjustment signal 100*d* from the count adjuster 100. In the clock frequency divider 102 of the embodiment, fifteen stages of T-type flip-flop are cascaded for frequency-dividing the clock signals CLK (10*e*) supplied into an output signal 10*f* having the frequency of 1 Hz.

Reverting to FIG. 1, the clock frequency division controller 10*b* generates a control signal 10*g* and a reset signal 10*j* from the output signal 10*f*, supplied from the time-base counter 10*a*, and the reference signal 10*i* to output the so generated signals to the time-base counter 10*a*. The reference signal 10*i* is directed to a signal containing a time base signal supplied from outside. The control signal 10*g* contains not only the delay control signal DELAY (10*h*) but also a hastening control signal (HASTEN) 10*k*, which will be described in detail.

Figure 3:
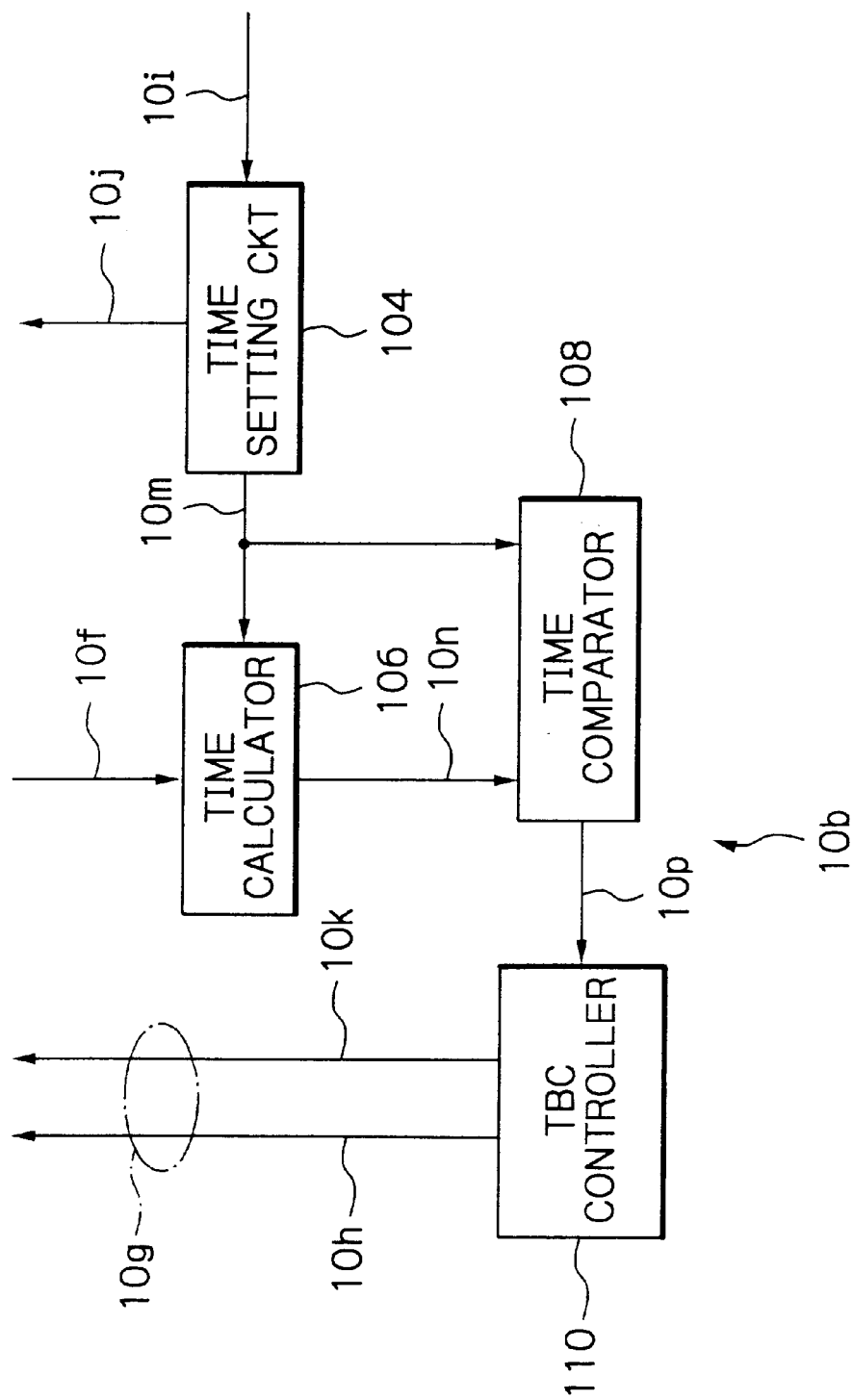
FIG. 3 is a block diagram showing a schematic configuration of a clock frequency division controller included in the embodiment shown in FIG. 1.

The clock frequency division controller 10*b* includes a time setting circuit 104, a time calculator 106, a time comparator 108 and a TBC controller 110, interconnected as shown in FIG. 3. The time setting circuit 104 is adapted to generate a time signal 10*m*, indicating the reference time, based on the reference signal 10*i* supplied, to output the so generated signals to the time calculator 106 and to the time comparator 108. The time setting circuit 104 also generates the reset signal 10*j* for resetting the counting operation of the time-base counter 10*a* to its initial state.

From the time signal 10*m* supplied and the output signal 10*f* from the time-base counter 10*a*, the time calculator 106 calculates the time when a preset period of time lapses. When the next time signal 10*m* is supplied, the time calculator 106 outputs to the time comparator 108 a time signal 10*n* indicative of the time calculated immediately previously.

The time comparator 108 is adapted to compare the time signal 10*n* with the signal 10*m* as a reference, for example, supplied simultaneously from the time calculator 106 and the time setting circuit 104, respectively. The time comparator 108 provides the TBC controller 110, as results of comparison 10*p*, with a sign indicating the lag, normal and leading states of the time signal 10*m*, together with an offset corresponding to the lag or leading of the time signal.

The TBC controller 110 is adapted to generate at least one of a lag control signal 10*h* and a lead control signal 10*k*, as the control signal 10*g*, based on the result of comparison 10*p* supplied. The TBC controller 110 also calculates the proportion of the generated control signal 10*g*. For example, if the timepiece leads one second per day, an error is 1/(60× 60×24), from the number of seconds in error per number of seconds per day, or approximately +11.6 ppm. In this case, it is sufficient to cancel approximately 32,768 clocks in the period of 85,400 seconds, that is, 100 clocks may be canceled in the period of about (86,400×100)/32,768=264 seconds. The rate of generation is 100 delay control signals DELAY (10*h*) in the period of 264 seconds. The TBC controller 110 calculates the proportion of generation to generate the control signal 10*g* is output to the time-base counter 10*a*.

Although the embodiment is described for the clock frequency division controller 10*b* implemented in the form of hardware, the controller 10*b* may also be implemented by software-based programming processing as a microcomputer application.

Figure 4:
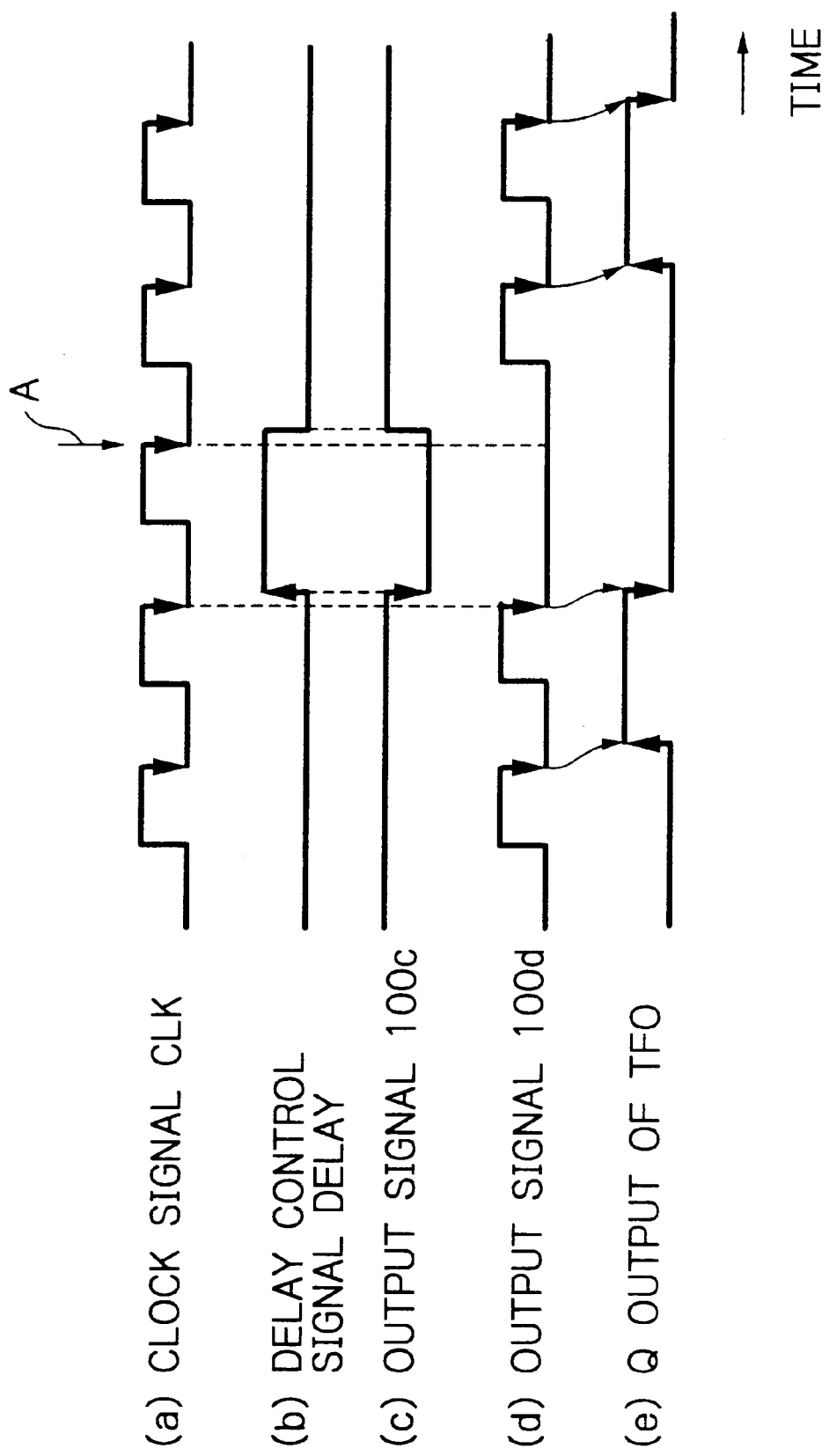
FIG. 4 is a timing chart for useful for understanding the operation of the time-base counter shown in FIG. 2.

The operation of the time-base counter 10*a*, responsible for frequency correction in the frequency adjuster 10, is now described with also reference to FIG. 4. To the count adjuster 100 in the time-base counter 10*a* are supplied the clock signal CLK (10*e*) and the delay control signal DELAY (10*h*) of FIG. 4, lines (a) and (b), respectively. The delay control signal DELAY (10*h*) rises positive with a delay as from the negative-going edge of the clock signal CLK. The output signal 100*c* of FIG. 4, line (c), is a signal inverted in level of the delay control signal DELAY (10*h*) by the inverter 100*a*. The output signal 100*c* and the clock signal CLK are sent out to the AND gate 100*b*.

The delay control signal DELAY (10*h*), during its high level, FIG. 4, line (b), causes the AND gate 100*b* to mask the clock signal CLK received on its clock input 10*e*. At the timing indicated by an arrow A, therefore, the output 100*d* of the AND gate 100*b* is inhibited from staying high. The first stage of T-type flip-flop TF0, FIG. 2, has its data input terminal D fed back from its Q-bar output 102*b*, which develops its level inverted from its Q output 102*a* shown in line (e) of FIG. 4. In response to the negative-going edge of the Q-bar output 102*b*, the flip-flop TF0 captures the signal thus appearing on its input port D. As a result, the Q output 102*a* takes the waveform shown in line (e). It is understood that one clock has been canceled.

Incorporation of the count adjuster 100 of the simplified configuration thus allows one clock to be canceled. If a preset number of the delay control signals DELAY are supplied during the predetermined time period period, it is possible to eliminate any variations contained in the clock signal CLK, without requiring an adjustment of the oscillator circuit 12. The present embodiment is thus adapted to correct the frequency in the delaying direction.

Figure 5:
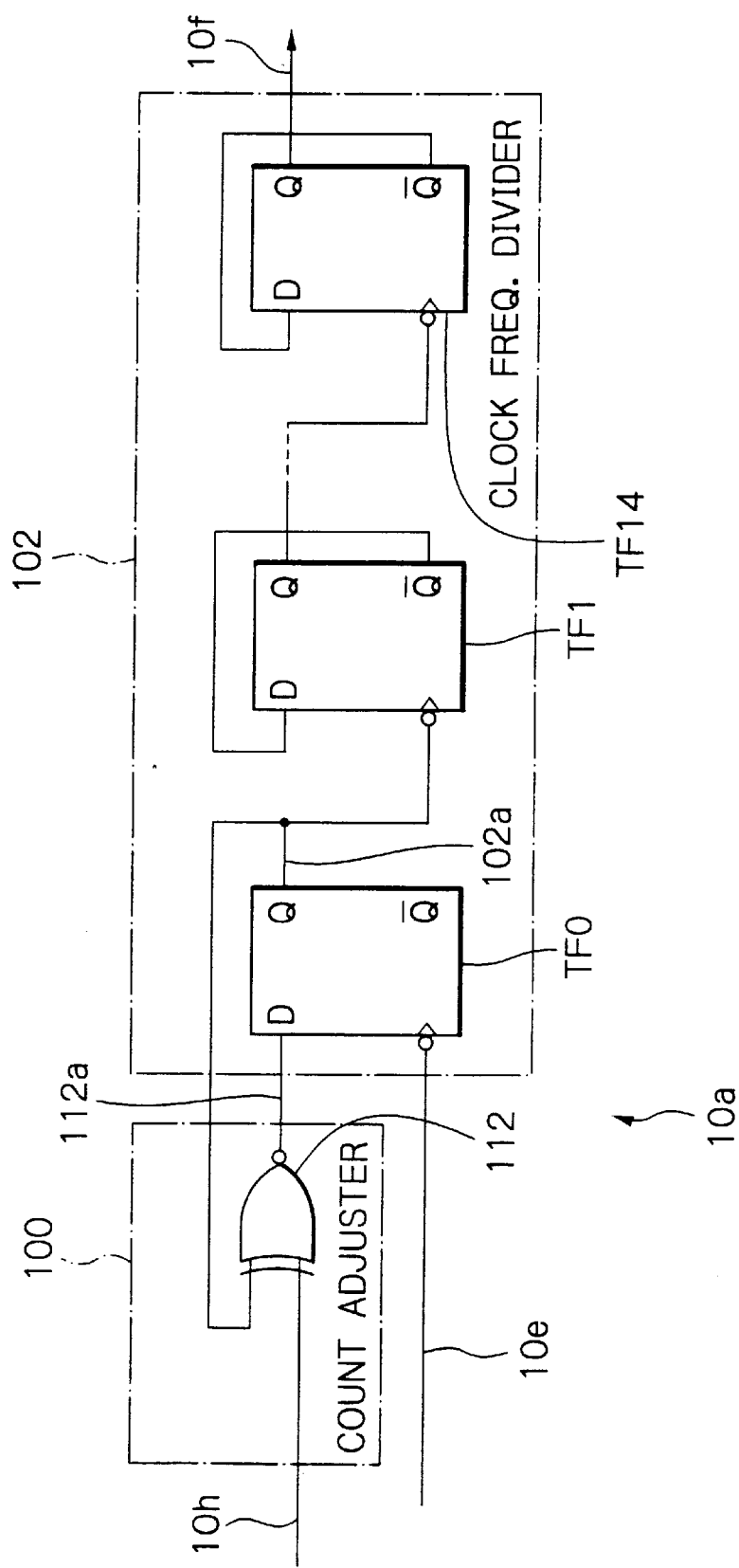
FIG. 5 is a schematic circuit diagram showing the configuration of a modification of the time-base counter shown in FIG. 2.

Certain modifications of the count adjuster 100 and the clock frequency divider 102 in the time-base counter 10*a* are hereinafter described. In the modified embodiment shown in FIG. 5, the count adjuster 100 includes a two-input exclusive inverting logical sum gate (ExNOR) 112. The exclusive NOR gate 112 has its one input receiving an output signal 102*a* fed back from the Q output terminal of the T-type flip-flop TF0, and its other input to which the delay control signal DELAY (10*h*) is input. The exclusive NOR gate 112 is connected to the data input terminal D of the T-type flip-flop TF0 to output the calculated results as the output signal 112*a*.

The connection of the T-type flip-flop TF0 differs from that in the previous embodiment, such that clock signal CLK (10*e*) is sent directly to its clock terminal. Moreover, in the T-type flip-flop TF0 does not use its Q-bar output terminal.

Figure 6:
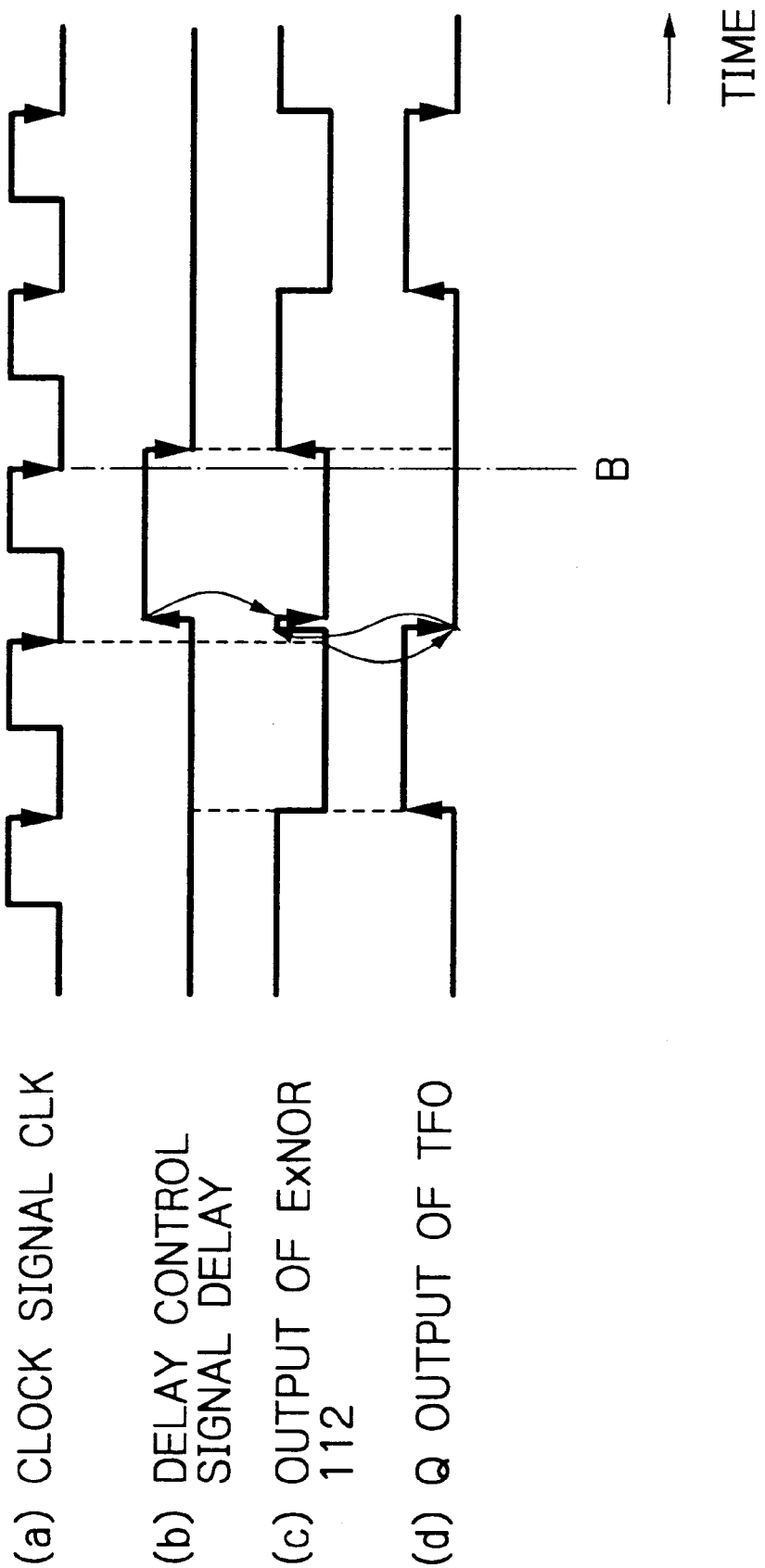
FIG. 6 is a timing chart for useful for understanding the operation of the time-base counter shown in FIG. 5.

The operation for the modified embodiment is now explained with reference to FIG. 6, lines (a) through (d). FIG. 6, lines (a) and (b), show the clock signals CLK (10*e*) and the delay control signal DELAY (10*h*). The exclusive NOR gate 112 shown in FIG. 6, line (c), outputs the output signal 112*a* at its high level as long as the input level is low. The output signal 112*a* (level High) is captured at the negative-going edge of the clock signal CLK, whereby the Q output 102*a* of the T-type flip-flop TF0 of FIG. 6, line (d), is at its high level. Subsequently, the exclusive NOR gate 112 sets the output signal 112*a* to its low level as the low level of the delay control signal and the high level of the Q output 102*a* of the T-type flip-flop TF0 are input.

In this level state, the T-type flip-flop TF0 captures the low level shown in FIG. 6, line (c), with the negative-going edge of the next clock signal CLK, to cause the output signal 102*a* from the Q output terminal to be switched from its high to low level in FIG. 6, line (d). The delay control signal DELAY (10*h*) is subsequently supplied. That is, the high level causes the exclusive NOR gate 112 to set its output signal 112*a* to its low level in FIG. 6, line (c).

At the negative-going edge of the next clock signal CLK at the timing B, FIG. 6, the T-type flip-flop TF0 takes in the low level. However, no level changes at this timing, even though the clock is input. This operation cancels one clock. The exclusive NOR gate 112 sets its output signal 112*a* to its high level at the same time as the delay control signal DELAY (10*h*) goes to its low level. Since the high level of the output signal 112*a* is captured at the negative-going edge of the next clock signal CLK, the output signal 102*a* of the T-type flip-flop TF0 of FIG. 6, line (d), goes to its high level.

Thus, the clock can be canceled, responsive to the inputting of the delay control signal DELAY, even with the modified embodiment of the count adjuster 100 interconnected to the T-type flip-flop TF0. In the present embodiment, frequency correction may be made in the delaying direction.

Figure 7:
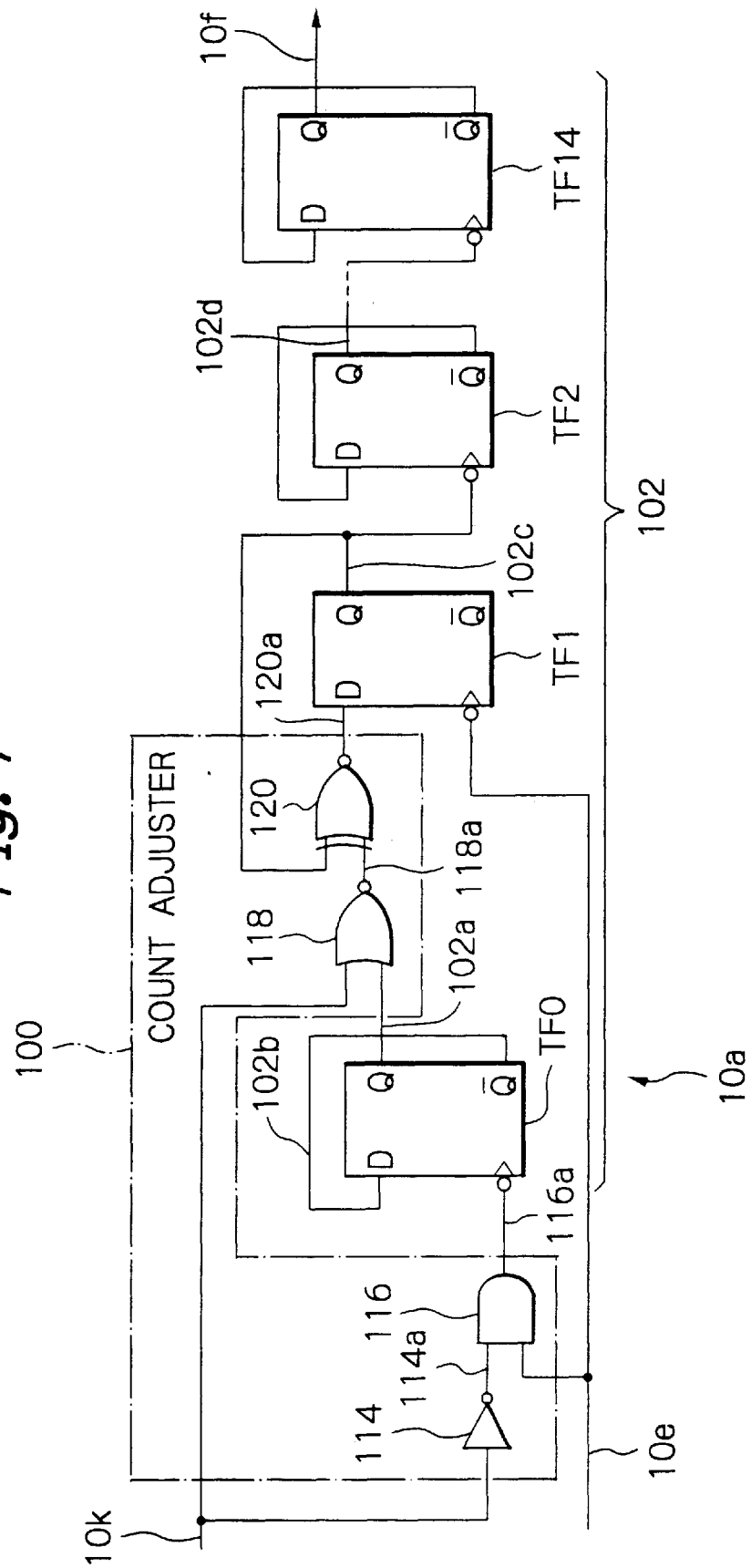
FIG. 7 is a schematic circuit diagram showing the configuration of an alternative modification of the time-base counter shown in FIG. 2.

In a further alternative embodiment described below, the count adjuster 100 includes an inverter 114, a two-input AND gate 116, a two-input NOR gate 118, and a two-input exclusive NOR gate 120, as shown in FIG. 7. A hastening control signal HASTEN (10*k*) is sent to the inverter 114, which is adapted to send out a level-inverted signal 114*a* to one input of the AND gate 116, while the clock signal CLK (10*e*) is supplied to the other input of the AND gate 116. The AND gate 116 sends out an output signal 116*a* to the clock terminal of the T-type flip-flop TF0. This connection thus masks the clock signal CLK during the period of time the hastening control signal HASTEN (10*k*) is supplied.

Prior to the T-type flip-flop TF1, arranged are a NOR gate 118 and an exclusive NOR gate 120. To the NOR gate 118 are supplied the hastening control signal HASTEN (10*k*) and the output signal 102*a* of the T-type flip-flop TF0. The NOR gate 118 sends out its output signal 1118*a* to the exclusive NOR gate 120. To the other input of the exclusive NOR gate 120 is fed back the output signal 102*c* of the second stage T-type flip-flop TF1. The exclusive NOR gate 120 sends its output signal 120*a* to the data input terminal D of the T-type flip-flop TF1. To the clock terminal of the T-type flip-flop TF1 are supplied clock signals CLK. The T-type flip-flop TF1 sends the output signal 102*c* of the Q output terminal as the clock signal for the next T-type flip-flop TF2. The circuit downstream of this point is the connection for usual clock frequency division for taking out the desired frequency, 1 Hz in the embodiment.

Figure 8:
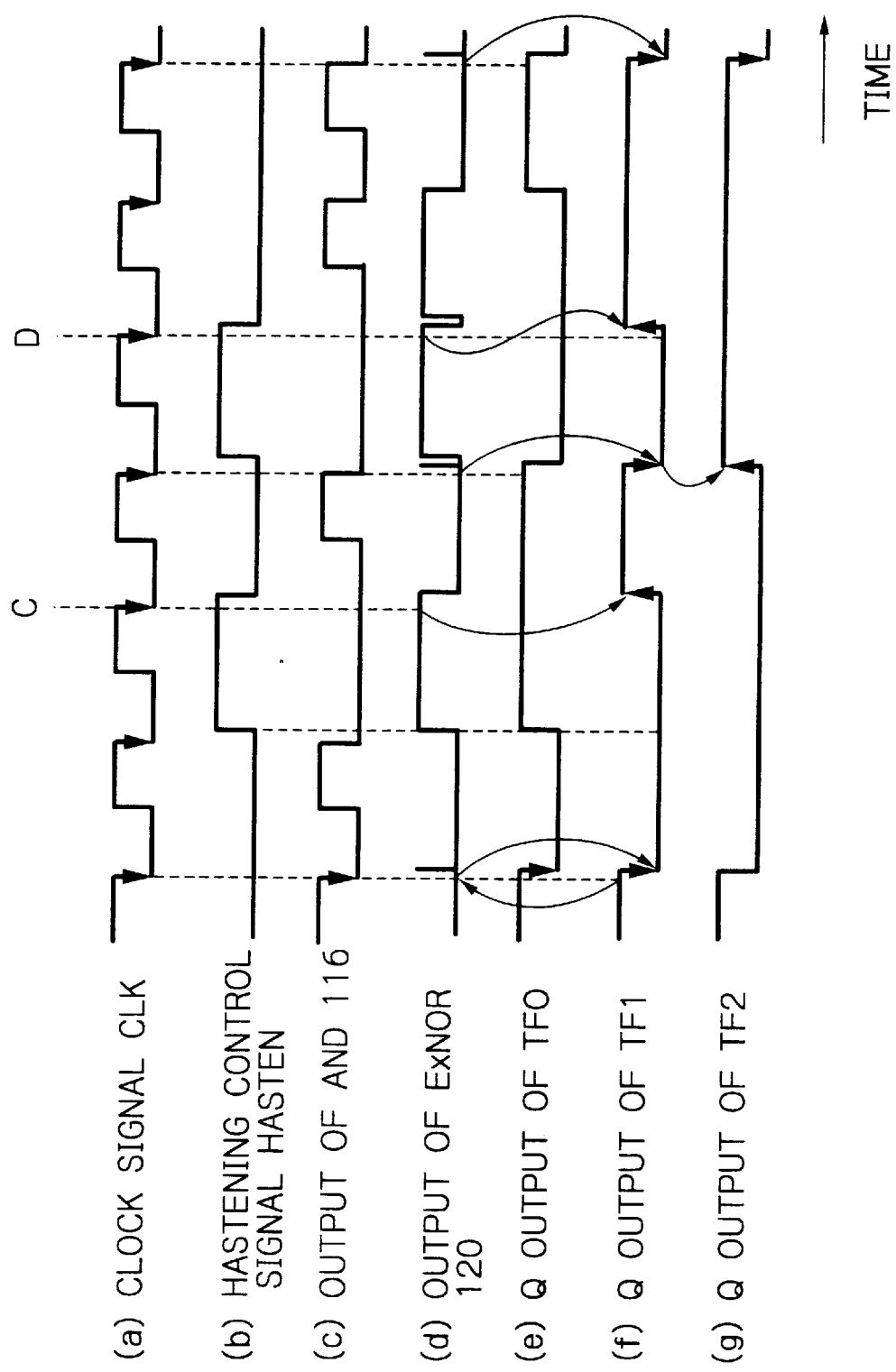
FIG. 8 is a timing chart for useful for understanding the operation of the time-base counter shown in FIG. 7.

Referring now to FIG. 8, the operation of the count adjuster 100 of the illustrative modified embodiment is described. FIG. 8, lines (a) and (b), show the clock signals CLK (10*e*) and the hastening control signal HASTEN (10*k*), respectively. The output signal 116*a* of the AND gate 116, shown in FIG. 8, line (c), cancels the clock signals CLK from being input to the T-type flip-flop TF0 during the period in which the hastening control signal HASTEN (10*k*) takes its high level. That is, there is no negative-going edge of the clock signals at the positions of timing C and D in FIG. 8.

FIG. 8, line (d), shows an output signal 120*a* of the exclusive NOR gate 120, while lines (e), (f) and (g) show output signals 102*a*, 102*c* and 102*d* of the T-type flip-flops TF0, TF1 and TF2, respectively. Although not shown, the NOR gate 118 outputs the low level to the exclusive NOR gate 120 during the time period when the hastening control signal HASTEN is at its low level and the Q output 102*a* of the T-type flip-flop TF0 is at its high level. Since the Q output of the T-type flip-flop TF1 supplies its high level, the exclusive NOR gate 120 sets and outputs the output signal 120*a* at its low level.

The T-type flip-flop TF1 captures the output signal 120*a* of the exclusive NOR gate 120 at the timing of the negative-going edge of the clock signal CLK. The T-type flip-flop TF1 is responsive thereto to set the output signal 102*c* from the Q output terminal to its low level shown in FIG. 8, line (f). The exclusive NOR gate 120 is responsive to the low level of the output signal 102*c* to produce a pulse at the high level shown in FIG. 8, line (d). This high level pulse is supplied to the exclusive NOR gate 120 responsive to the low level of the output signal 102*a* of the T-type flip-flop TF0 supplied to the NOR gate 118 and the low level of the hastening control signal HASTEN (10*k*). Since the low level is supplied to the exclusive NOR gate 120 at this time, the exclusive NOR gate 120 sets the output signal 120*a* to its low level.

When next the hastening control signal HASTEN (10*k*) goes to its high level shown in FIG. 8, line (b), the output signal 118*a* of the NOR gate 118 goes to its low level, without dependency on the output of the T-type flip-flop TF0. Since the output signal 102*c* of the T-type flip-flop TF1 is also at its low level, the exclusive NOR gate 120 sets the output signal 120*a* to its high level during the high level period of the hastening control signal HASTEN (10*k*).

Meanwhile, clock signals CLK are supplied to the T-type flip-flop TF1. At a timing position C, the T-type flip-flop TF1 receives the high level and, at the negative-going edge of the next clock signal CLK, the T-type flip-flop TF1 receives the low level. Thus, the T-type flip-flop TF1 sends the negative-going edge of output signal 102*c* to the T-type flip-flop TF2. Responsive thereto, the T-type flip-flop TF2 goes to the high level shown in FIG. 8, line (g).

The timing the high level is achieved with the T-type flip-flop TF1 is inherently produced by supply of four clock signals CLK. If attention is paid to the output signal 102*d* from the Q output terminal of the T-type flip-flop TF2 shown in FIG. 8, line (g), the output signal 102*d* rises with three input clocks. By this operation, the clocks are hastened by one clock.

The same relationship holds at the position of the timing D at which the hastening control signal HASTEN (10*k*) is again supplied after one clock. Since the exclusive NOR gate 120 receives the signals of low and high levels at this time on its input terminals, it produces the output signal 120*a* at its low level. The T-type flip-flop TF1 captures the low level at the negative-going edge of the clock signal CLK to set the output signal 102*c* from the Q output terminal to its low level. Thus, the T-type flip-flop TF2 captures the low level so that its output goes low. The period of time in which the high level is taken from the timing D to the negative-going edge shown in FIG. 8, line (f) corresponds to three clock signals CLK. In this manner, the T-type flip-flop TF2 provides the clocks having a phase leading one clock period to continue its frequency division to generate the desired frequency, as shown in FIG. 8, line (g).

With the modified embodiment of the count adjuster 100 interconnected to the T-type flip-flop TF0 to TF2 described above, the clocks may be hastened by one clock period responsive to the hastening control signal HASTEN. For example, if the hastening control signal HASTEN (10*k*) is supplied for providing a lead of 100 counts in the period of about 264 seconds, the frequency adjuster 10 is able to accomplish the correction of hastening the clocks, which would otherwise be delayed one second per day, so that the clocks will be hastened by one second to compensate for the clock delay.

Figure 9:
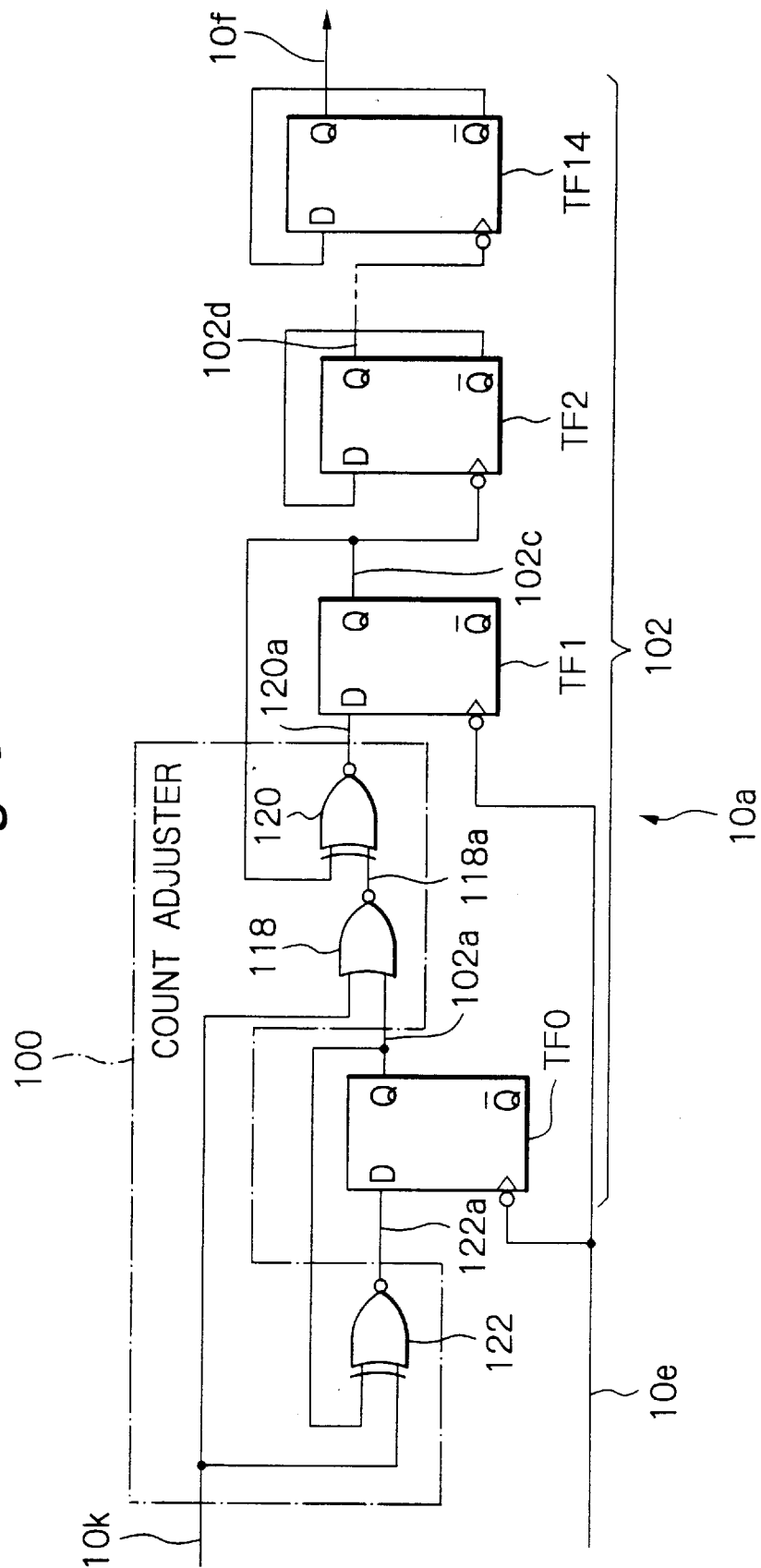
FIG. 9 is a schematic circuit diagram showing the configuration of another alternative modification of the time-base counter of FIG. 2.

A still further modified embodiment of the count adjuster 100 includes, as shown in FIG. 9, two-input exclusive NOR gates 120 and 122, and a two-input NOR gate 118 interconnected as illustrated. As for the interconnection, the exclusive NOR gate 122 is interconnected in the same fashion as that of the exclusive NOR gate 112 in the modified embodiment described with reference to FIG. 5 only except for the control signal supplied being the hastening control signal HASTEN (10k). In addition, the NOR gate 118 and the exclusive NOR gate 120, included in the modification described with reference to FIG. 7, are employed for hastening the count. However, the connection associated with the NOR gate 118, which is similar to that in the FIG. 7 modification in that the hastening control signal HASTEN (10k) is supplied to its one input, differs therefrom in that the output signal 102a from the output terminal of the T-type flip-flop TF0 is supplied to its other input. The interconnections of the exclusive NOR gate 120 and the T-type flip-flops TF1 and TF2 are wholly identical to those in the FIG. 2 modification.

Figure 10:
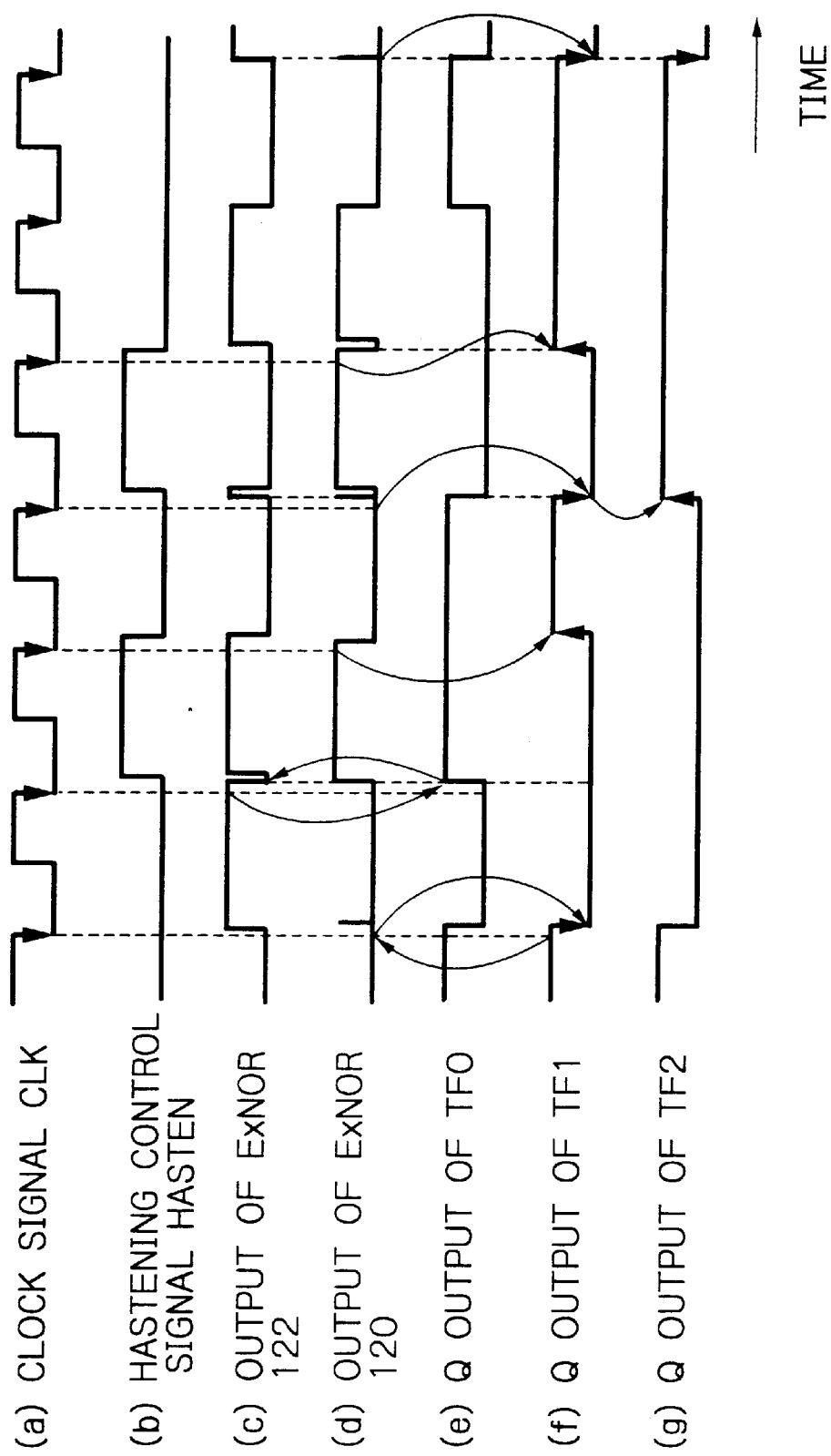
FIG. 10 is a timing chart for useful for understanding the operation of the time-base counter shown in FIG. 9.

In operation, the timing of FIG. 10, lines (a), (b), (e), (f) and (g) is the same as that in FIG. 8, lines (a), (b), (e), (f) and (g), respectively, and hence will not be described. Since an exclusive NOR gate 122 is used for canceling the clock signal CLK, the output signal 122a differs from the output of FIG. 8, line (c). Since the hastening control signal HASTEN (10k) is at its low level, as depicted in FIG. 10, line (c), the exclusive NOR gate 122 outputs the low level during the time period in which the output signal 102a of the T-type flip-flop TF0 takes its high level.

Subsequently, during the time when the T-type of flip-flop TF0 develops the low level on its output 102a to the exclusive NOR gate 122, the exclusive NOR gate 122 outputs the high level on its output port 122a. The flip-flop TF0 captures that high level on its input port 122a in response to the negative-going edge of the clock signal CLK on its input port 10e to produce the high level. The exclusive NOR gate 122 in turn receives the high and low levels on its input ports 102a and 10k, respectively, to output the low level on its output port 122a. At this moment, the T-type of flip-flop TF1 and the NOR gate 118 output the low levels 102c and 118a, respectively, to the exclusive NOR gate 120. The exclusive NOR gate 120 in turn produces the high level on its output port 120a. With the instant modification, the exclusive NOR gate 120 has its output signal 120a shifted to its high level earlier than done in FIG. 8, line (d). Correspondingly to this positive-going timing of the Exclusive NOR gate 120, the T-type of flip-flop TF0 produces the high level earlier on its output 102a, FIG. 10, line (e).

When the hastening control signal HASTEN (10k) is supplied subsequently, the high level is supplied to both inputs of the exclusive NOR gate 122, so that the high level from the exclusive NOR gate 122 is continued to be output during the high level duration of the hastening control signal HASTEN (10k). Since the output signal 102a of the T-type flip-flop TF0 goes to its low level, while the hastening control signal HASTEN (10k) again goes to its high level, a waveform inverted from the previous waveform is output. In this manner, the exclusive NOR gate 122 performs adjustment in such a manner that a signal, having the same relative level as that of the output signal 102a of the T-type flip-flop TF0, will be supplied during the time period when the hastening control signal HASTEN (10k) is supplied.

It will be appreciated that, as seen from the waveforms shown in FIG. 10, lines (f) and (g), there is no problem raised in connection with the offset caused by the hastened timing as described above, such that the output signals 102c and 102d similar to those in FIG. 8, lines (f) and (g), may be obtained.

By employing the exclusive NOR gate 122 for canceling the clock signal CLK in the count adjuster 100 interconnected in the same fashion as that of the T-type flip-flops TF0 to TF2 of the FIG. 7 modification, the clock progression can be hastened by one clock period responsive to the hastening control signal HASTEN (10k). Of course, if the hastening control signal HASTEN (10k) is supplied in such a manner that the clock progression will be hastened by for example 100 counts in the period of about 264 seconds, the frequency adjuster 10 is able to make corrections in such a manner that the clock progression, which would otherwise delayed one second per day, will be hastened by one second to compensate for the lag.

Figure 11:
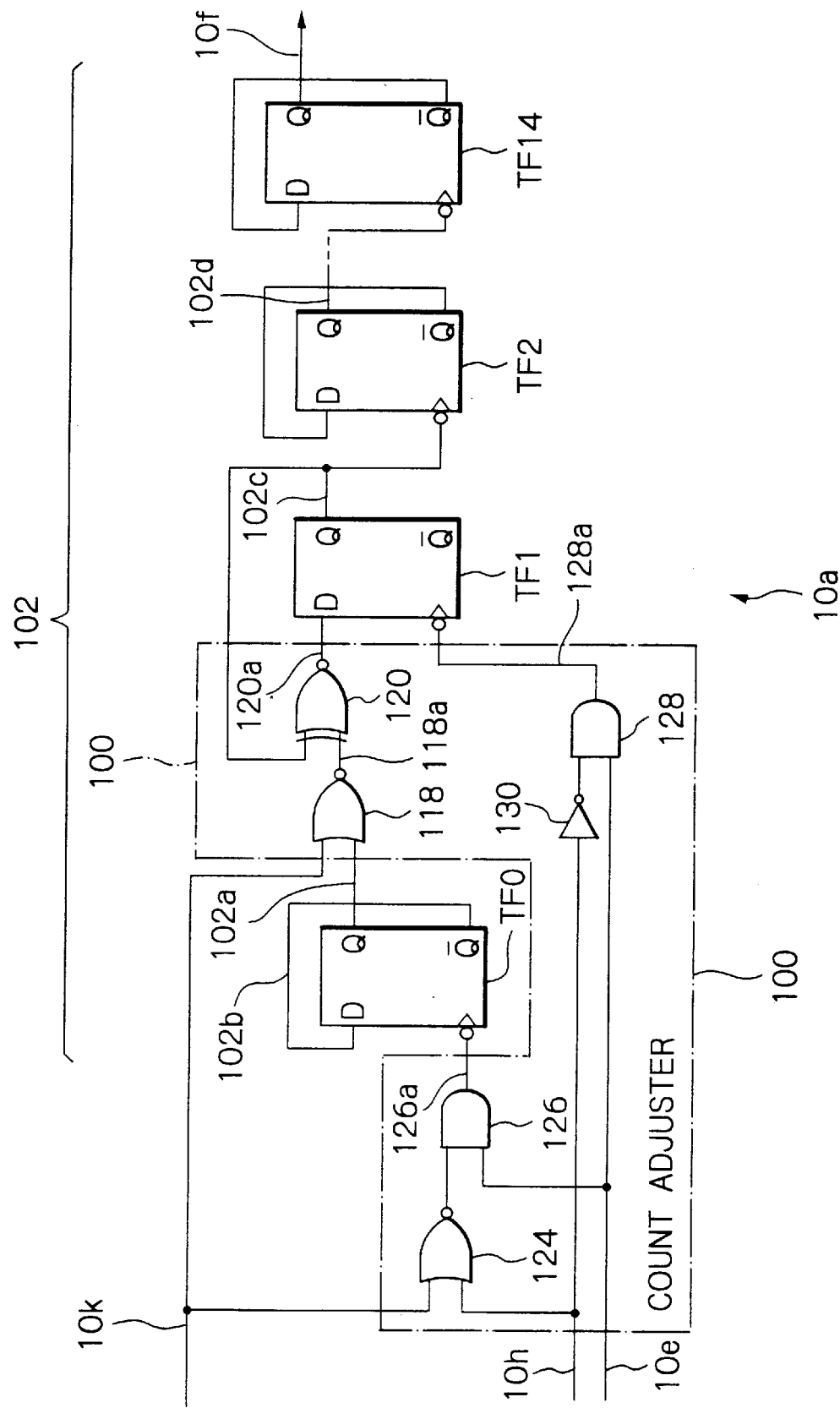
FIG. 11 is a schematic circuit diagram showing the configuration of a further alternative modification of the time-base counter of FIG. 2.

The count adjuster 100 of still another embodiment includes two-input NOR gates 118 and 124, two-input AND gates 126 and 128, an inverter 130 and a two-input exclusive NOR gate 120, interconnected as shown in FIG. 11. To the NOR gate 124 are supplied the delay control signal DELAY (10h) and the hastening control signal HASTEN (10k). The NOR gate 124 outputs the calculated results to one input of the AND gate 126, to the other input of which the clock signals CLK are supplied. The AND gate 126 sends the calculated result to a clock terminal of the T-type flip-flop TF0.

The delay control signal DELAY (10h) is sent to the inverter 130, which in turn sends the level-inverted signal to one input of the AND gate 128, of which the other input receives the clock signals CLK. The AND gate 128 sends the logical product of the two inputs to the clock terminal of the T-type flip-flop TF1. This configuration is the same as that of the canceling means described in connection with the FIG. 2 embodiment except that the output 128a from the AND gate 128 in FIG. 11 is not connected to the T-type flip-flop TF0 but the clock terminal of the T-type flip-flop TF1.

The NOR gate 118, the exclusive NOR gate 120 and the T-type flip-flops TF0 and TF1 are interconnected in the same manner as that of the FIG. 7 modification described in connection with the count hastening means.

The operation is now described with reference to FIG. 12 also. The clock signals CLK shown in FIG. 12, line (a), are sent to the AND gates 126 and 128. The delay control signal DELAY (10h) and the hastening control signal HASTEN (10k) are routed to the NOR gate 124 at the timings shown in FIG. 12, lines (b) and (c), respectively. The NOR gate 124 sends out the thus supplied signals to one input of the AND gate 126 as it inverts the signal level from high to low. During the period of the low level shown in FIG. 12, line (d), the AND gate 126 provides the clock terminal of the T-type flip-flop TF0 with the clock signal CLK with its negative-going edge masked. During the remaining period of time, the clock signals CLK are supplied to the T-type flip-flop TF0. The AND gate 128 cancels one clock signal CLK, responsive to the delay control signal DELAY (10h) to forward the resulting clock signals to the clock terminal of the T-type flip-flop TF1.

Figure 12:
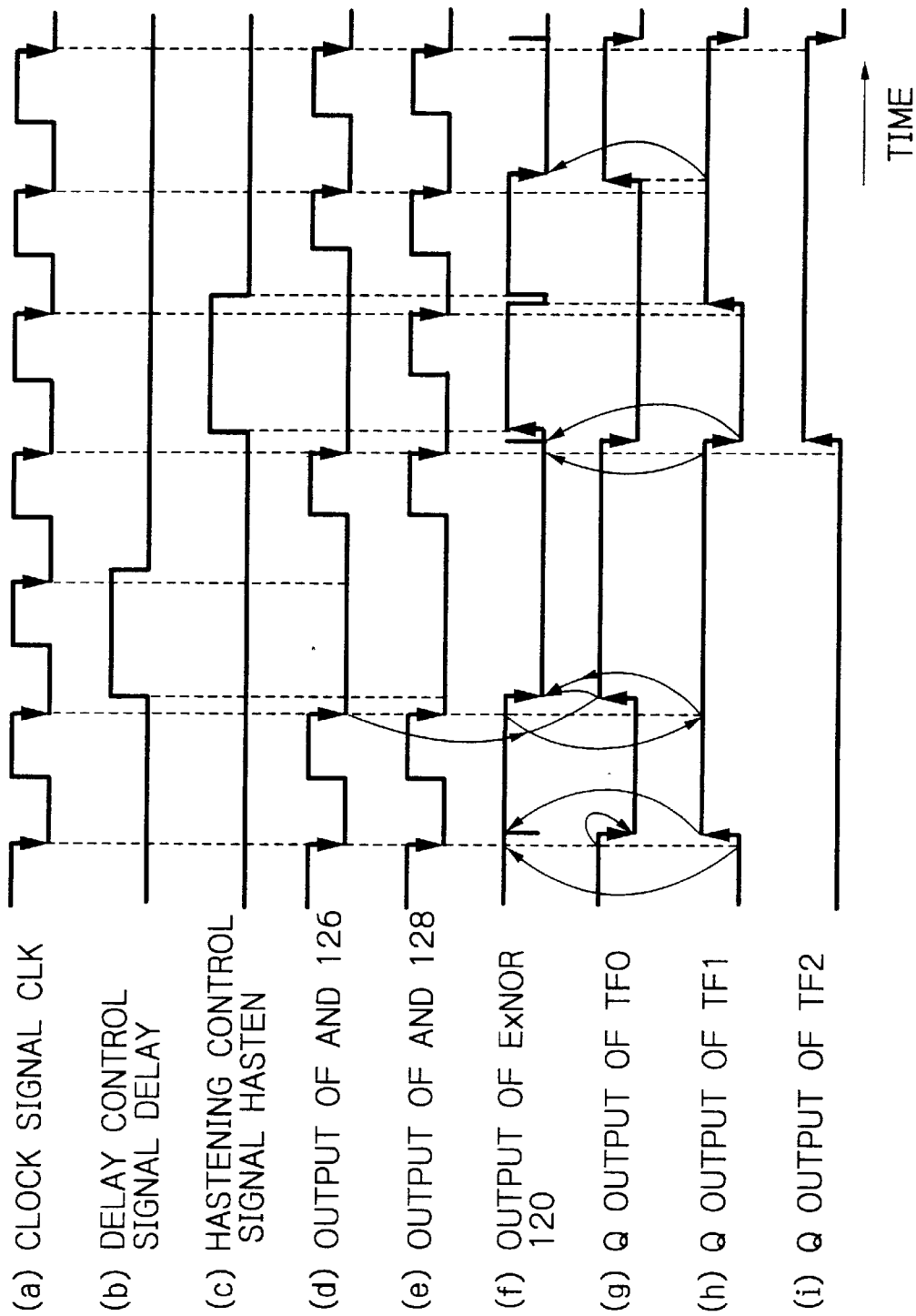
FIG. 12 is a timing chart for useful for understanding the operation of the time-base counter shown in FIG. 11.

At the time of negative-going edge of the first clock signal CLK in FIG. 12, line (a), the T-type flip-flop TF0 outputs the high level, as shown in FIG. 12, line (g), from its Q output. This causes the NOR gate 118 to output the low level to the one input of the exclusive NOR gate 120. Since the output signal 102c of the T-type flip-flop TF1 is fed back to the exclusive NOR gate 120 at the low level, the exclusive NOR gate 120 outputs the high level.

On the other hand, the outputs of the AND gates 126, 128 also go from high to low level responsive to the negative-going edge of the initial clock signal CLK in FIG. 12, line (a). Responsive thereto, the T-type flip-flop TF0 captures the low level output signal 102b from the Q-bar output terminal to output a low level. The NOR gate 118 and the T-type flip-flop TF1 at this time output the high and the low level to the exclusive NOR gate 120, respectively. On receipt of these levels, the exclusive NOR gate 120 outputs the low level. The output signal 102c of the T-type flip-flop TF1 is at its high level, because the flip-flop TF1 outputs the high level of the signal which has been received at its negative-going edge.

At the second negative-going edge of the clock signals, the T-type flip-flop TF0 captures the Q-bar output signal 102b of high level so that it outputs a positive-going level. The T-type flip-flop TF1 captures the supplied high level to output the high level without changing the level. The NOR gate 118, producing the low level responsive to the positive-going edge of the output signal 102b, causes the exclusive NOR gate 120 to be switched to produce the low level.

At a third negative-going edge of the next clock signal CLK, since the negative-going edge is masked and canceled, as indicated by output signals 126a and 128a of the AND gates 126 and 128, no change is caused on the outputs in FIG. 12, lines (f) to (i). This gives a period during which one clock has been canceled, as shown in FIG. 12, line (g).

At the fourth negative-going edge of the clock signals CLK, the T-type flip-flop TF0 captures the low level output signal 102b from its Q-bar port, and hence is switched from high to low level on its output. On the other hand, the exclusive NOR gate 120, which has so far output the low level, receives the high level from the NOR gate 118 and the T-type flip-flop TF1 in connection with the T-type flip-flop TF0 developing the low level. The exclusive NOR gate 120 now outputs the high level. Immediately thereafter, the T-type flip-flop TF1 receives the low level, and hence has the level switched to low. Thus, the exclusive NOR gate 120 produces the low level, resultantly generating pulses. Moreover, the T-type flip-flop TF2 is responsive to the negative-going edge of the output signal 102c supplied from the T-type flip-flop TF1 to issue a high level output signal 102d.

When the hastening control signal HASTEN (10k) is at its high level, the exclusive NOR gate 120 outputs the high level, because it receives the low level on its both inputs. Then, at a fifth negative-going edge of the clock signals CLK, the output of the exclusive NOR gate 120 goes from its high level to low. Since the exclusive NOR gate 120 receives the low level at this timing on its both inputs, the gate 120 outputs the high level. The T-type flip-flop TF1 captures this high level so that its output level rises as shown in FIG. 12, line (h). The exclusive NOR gate 120, supplied with the high level output signal 102c, produces the low level. The duration of this low level is sustained until the hastening control signal HASTEN (10k) goes to its low level.

Then, responsive to the sixth negative-going edge of the clock signals, the T-type flip-flop TF1 captures the high level output signal 102b of the T-type flip-flop TF0 to output the high level output signal 102c, so that the output of the exclusive NOR gate 120 is changed to its low level. On the seventh negative-going edge, the T-type flip-flops TF0 to TF2 are switched to produce the low level. At this time, the time duration of the high level output of the T-type flip-flop TF2 is shortened to the period of three clocks, as indicated in FIG. 12, line (i). This enables the clock progression to be hastened by one clock.

With the above arrangement, frequency correction may be made for coping with both the delay control signal DELAY (10h) and the hastening control signal HASTEN (10k) without adjusting the capacitance of the oscillator circuit 12.

Figure 13:
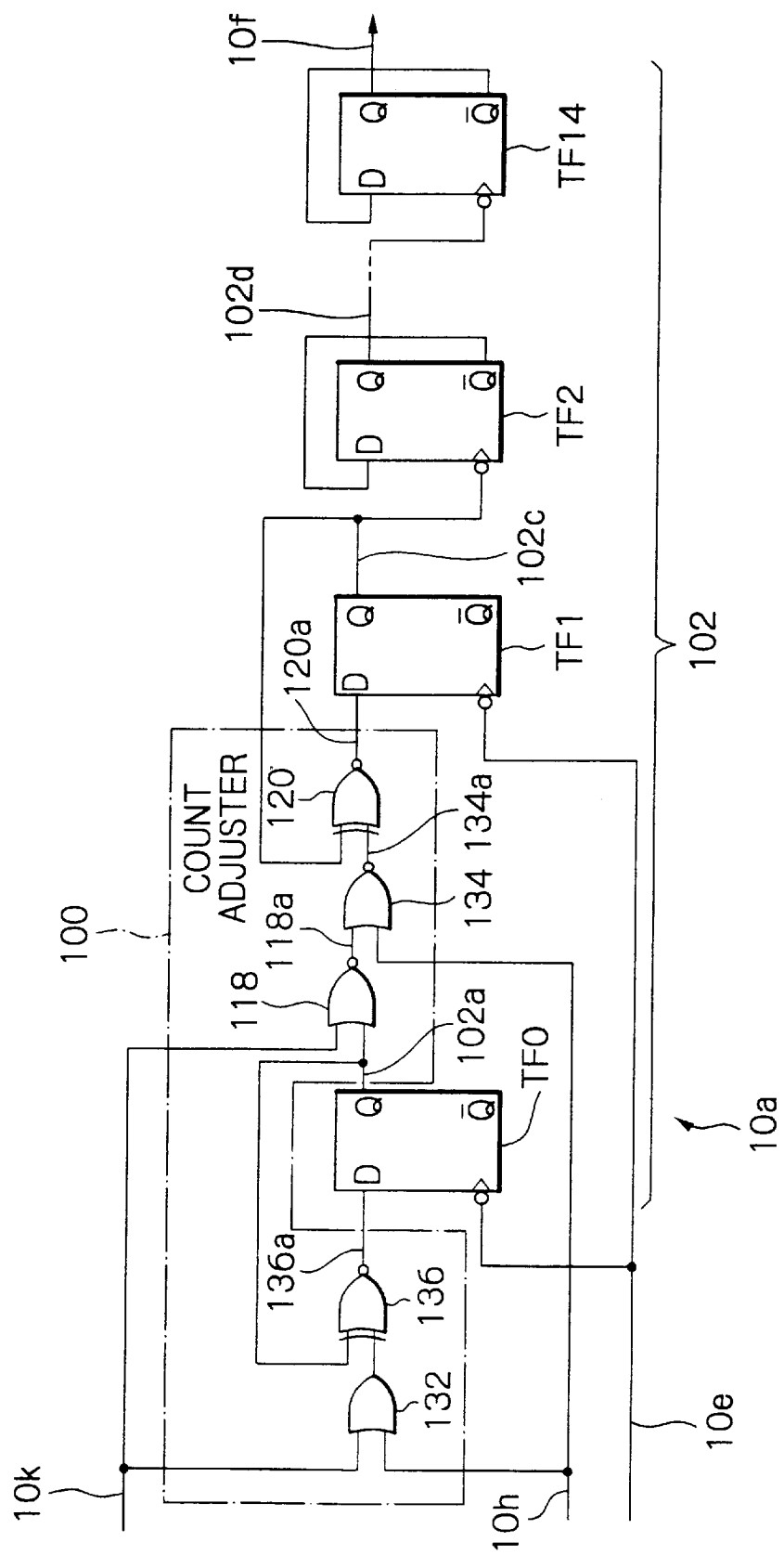
FIG. 13 is a schematic circuit diagram showing the configuration of a still further alternative modification of the time-base counter of FIG. 2.

The count adjuster 100 of the still another alternative embodiment includes, as shown in FIG. 13, two-input OR gates 132 and 134, two-input exclusive NOR gates 120 and 136, and a two-input inverting NOR gate 118, interconnected as illustrated. The count adjuster 100 is designed to extend the FIG. 9 modification, directed to the hastening control signal HASTEN (10k), so as to cover the delay control signal DELAY (10h). As compared to the modification shown in FIG. 9, the instant modification is featured by newly added OR gates 132 and 134. Briefly, the delay control signal DELAY (10h) and the hastening control signal HASTEN (10k) are respectively input to the OR gate 132, which is adapted to send the result of operation to an input of the exclusive NOR gate 136. This exclusive NOR gate 136 is equivalent to the exclusive NOR gate 122, FIG. 9.

The OR gate 134 is interconnected between the NOR gate 118 and the exclusive NOR gate 120. An output signal 118a of the NOR gate 118 is sent to one input of the OR gate 134, to the other input of which are supplied clock signals CLK. The OR gate 134 sends an output signal 134a representative of the results of the logical sum to the exclusive NOR gate 120. This arrangement again enables delay/hasten frequency correction.

The operation is briefly described with reference to FIG. 14, lines (a), (b) and (c), which illustrate the clock signals CLK, delay control signal DELAY (10h) and the hastening control signal HASTEN (10k). The OR gate 132 is supplied with the delay control signal DELAY (10h) and the hastening control signal HASTEN (10k) to send the result of the logical sum on these signals to the exclusive NOR gate 136. The output of the logical sum of these signals, shown for example in FIG. 10, line (b), is sent to the exclusive NOR gate 136.

Figure 14:
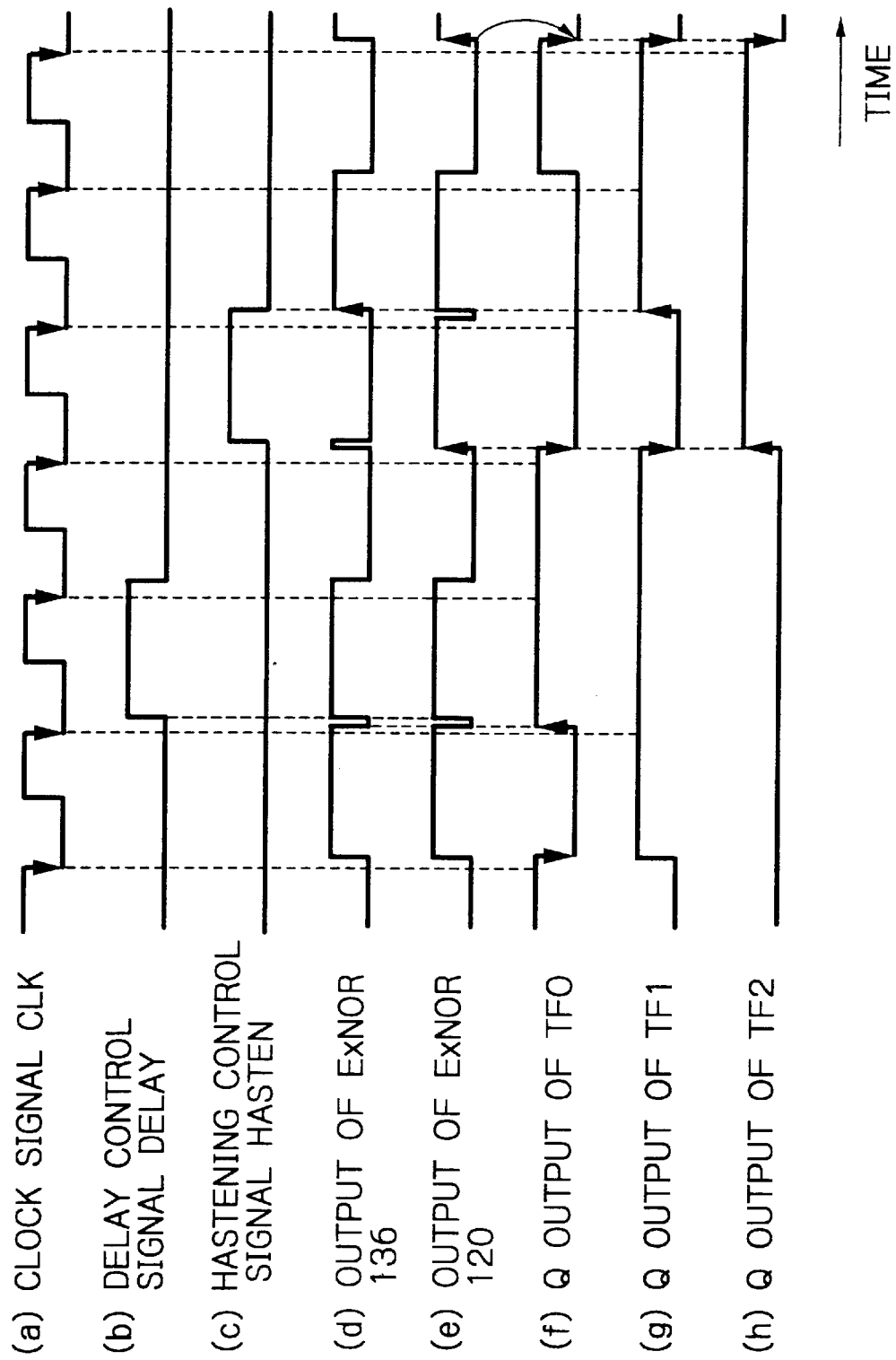
FIG. 14 is a timing chart for useful for understanding the operation of the time-base counter shown in FIG. 13.

As a result, the same timing relationship as that of FIG. 10, line (c), is established for the output signal 136a at the exclusive NOR gate 136 of FIG. 14, line (d). The output signal 136a is sent to the data input terminal D to the T-type flip-flop TF0. When the output of the T-type flip-flop TF0, supplied with the delay control signal DELAY (10h) and with the hastening control signal HASTEN (10k), is at its high level, the output signal 102a of the T-type flip-flop TF0 at the negative-going edge timing of the clock signals CLK is output to maintain the output level of the exclusive NOR gate 136.

When the output signal 102a of the T-type flip-flop TF0 and the hastening control signal HASTEN (10k) are both at the low level thereof, the NOR gate 118 of the count adjuster 100 outputs the high level to the OR gate 134. The OR gate 134 outputs an output signal 134a, corresponding to the sum of the high level period of the NOR gate 118 and the high level period of the hastening control signal HASTEN (10k), to one input of the exclusive NOR gate 120. The exclusive NOR gate 120 is supplied with the output signal 134a and with the output signal 102c of the T-type flip-flop TF1 to output a waveform shown in FIG. 12, line (e).

When the hastening control signal HASTEN (10k) is supplied, the T-type flip-flop TF1 changes the output signal 102c from its Q terminal from the low to the high level, responsive to the fifth negative-going edge timing of the clock signals CLK. At the seventh negative-going edge, the T-type flip-flop TF1 captures the low level output signal 120a of the exclusive NOR gate 120 to set the low level of the output signal 102c. The output signal 102c is supplied to the clock terminal of the T-type flip-flop TF2. The output signal 102c is sent to the clock terminal of the T-type flip-flop TF2. The T-type flip-flop TF2 at this time captures the signal output from the Q-bar output terminal, on the data input terminal D, to shift the level from high to low. Since the hastening control signal HASTEN (10k) is supplied, it takes the period of three clocks for the T-type flip-flop TF2 to be controlled to switch the output level, thus skipping one clock period.

With the above-described configuration, frequency correction may be made for coping with both the delay control signal DELAY (10h) and the hastening control signal HASTEN (10k), without adjusting the capacitance of the oscillator circuit 12.

In the foregoing embodiments, a ripple carry counter, employing a T-type flip-flop TF, is used as an example for the clock frequency divider 102 in the time-base counter 10a. Alternatively, a synchronous counter may also be used.

Figure 15:
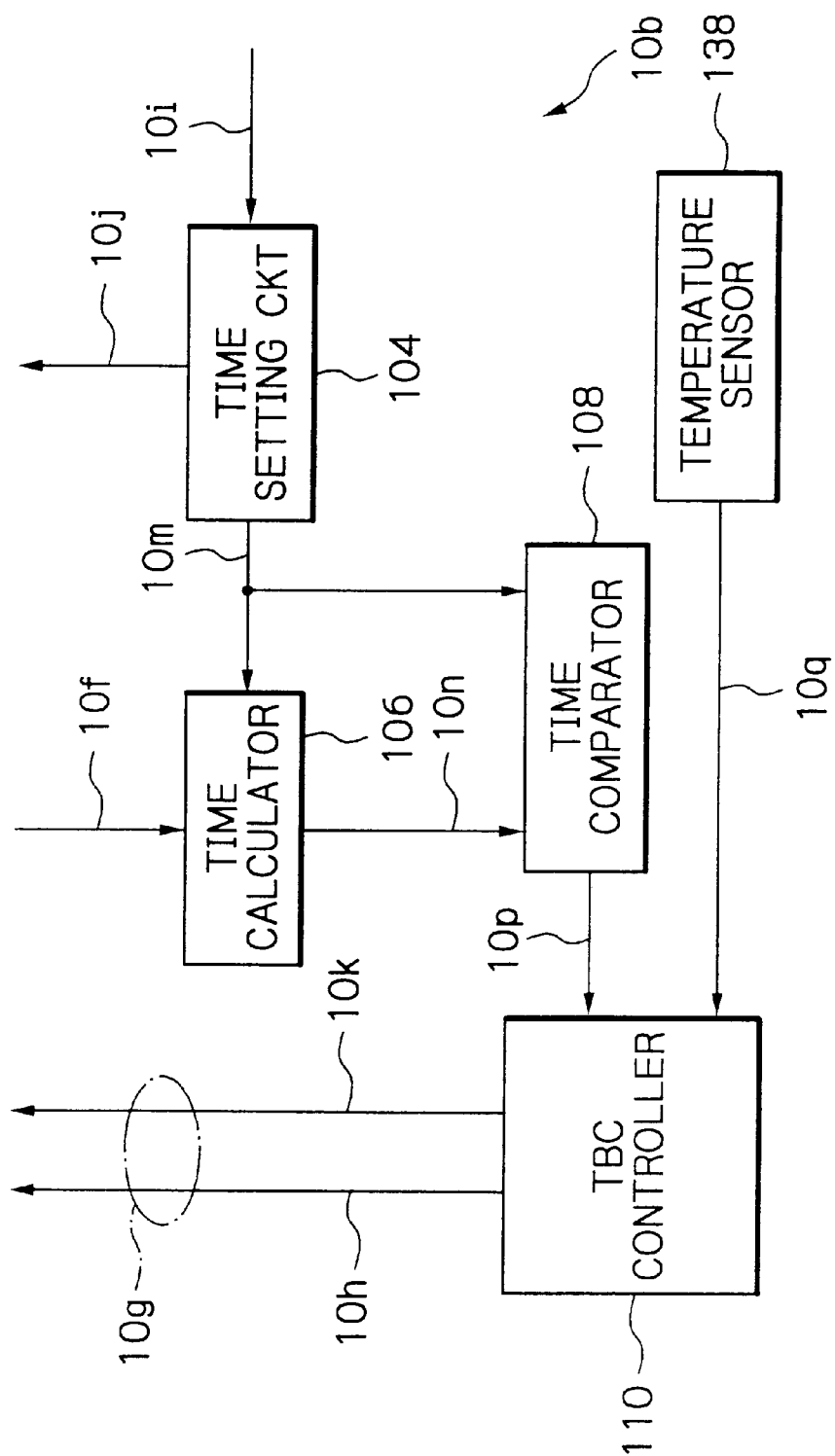
FIG. 15 is a schematic block diagram illustrating the clock frequency division controller of FIG. 3 with a temperature sensor added.
Figure 16:
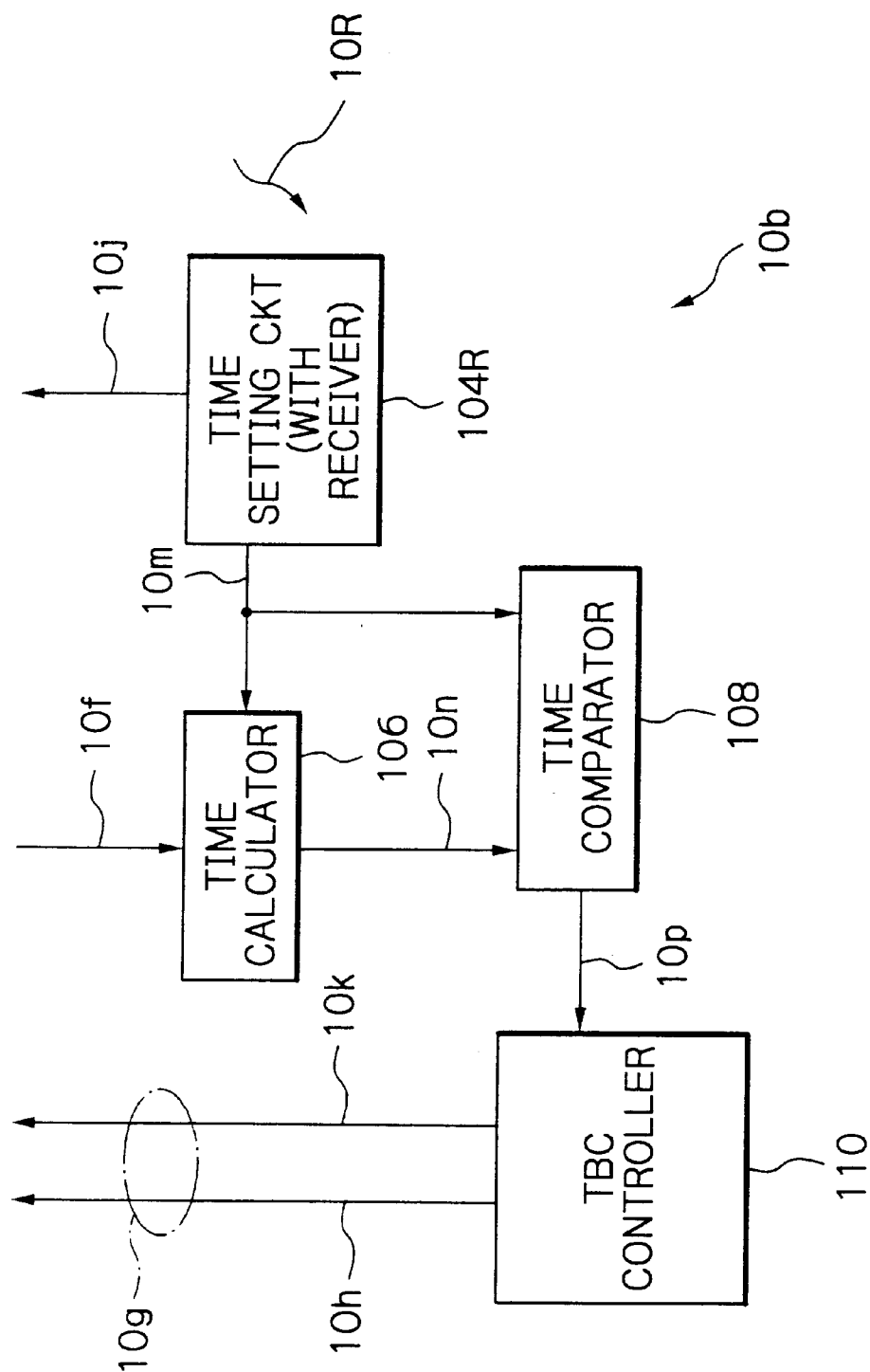
FIG. 16 is a schematic block diagram illustrating the clock frequency division controller of FIG. 3 with a time setting circuit having a receiver.

Referring now to FIGS. 15 and 16, an alternative configuration of the clock frequency division controller 10b is now described. In the clock frequency division controller 10b shown in FIG. 15, a temperature sensor 138 is arranged in addition to the configuration shown in FIG. 3. The temperature sensor 138 is adapted to sense the ambient temperature to output resulting temperature data 10q to the TBC controller 110. In response to the temperature data supplied, the TBC controller 110 produces the control signal 10g associated with temperature changes to the time-base counter 10a. This enables the clock frequency division controller 10b to correct, depending on temperature changes, the clocks 10f, into which the oscillating frequency is frequency-divided by the clock frequency divider 102 of the time-base counter 10a. Thus, the count adjuster 10 is able to effect more accurate correction than is possible with the conventional system.

A further alternative structure of the clock frequency division controller 10b shown in FIG. 16 includes the time setting circuit 104R fitted with a receiver function in place of the time setting circuit 104 shown in FIG. 3. The time setting circuit fitted with the receiver function 104R is adapted to receive radio waves 10R, including the timepiece information, to effect time setting automatically in the system. It is known that in general a type of receiver conventionally applicable to the time setting circuit 104R would consume considerable electric power when receiving timepiece data. By accurately correcting the frequency using the time-base counter 10a described above, the number of times of receiving such timepiece information will totally be reduced so as to contribute to saving in power consumption appreciably. The clock frequency division controller 10b of FIGS. 15 and 16 may, of course, be combined with the time-base counter 10a of any of the above-described embodiments.

Meanwhile, the time setting circuit 104R of the clock frequency division controller 10b may not integrally include the receiver function per se. In the clock frequency division controller 10b, such a time receiver, not shown, may be arranged separately from the time setting circuit 104 proper. In this case, the time receiver is adapted to transfer received timepiece data to the time setting circuit 104.

In the frequency adjuster 10 shown in FIG. 1, capacitors for correcting frequency and analog switches may be provided between the input terminal 10c and the time-base counter 10a, although not specifically shown. The capacitors for correcting frequency may be of the capacitance, for example, 1 pF, 2 pF, 4 pF and 8 pF, and have one plate connected in parallel to the input terminal 10c, with the other plate grounded. As analog switches, switching devices, such as transfer gates, may be used, and arranged intermediate the input terminal 10c and the respective capacitors. The analog switches are adapted to be turned on and off responsive to control signals supplied from a control system, such as a microcomputer. The frequency adjuster 10 is controlled to selectively turn on and off those switches so as to increase or decrease the total capacitance of the circuit comprising those capacitors when the oscillating frequency of the oscillator circuit 12 lags or leads, respectively. This permits the oscillator circuit 12 to correct the oscillating frequency without employing costly trimmer capacitors.

The frequency adjuster 10 with the configuration described above includes the time-base counter 10a comprising the count adjuster and the clock frequency divider to adjust the timing to cancel an error contained in the clock signals. The frequency adjuster 10 is thus able to output the desired frequency without secular change. Since no costly trimmer capacitor is needed in the oscillator circuit but addition of a simplified circuit suffices, it is possible to suppress the cost.

The entire disclosure of Japanese patent application No. 2002-211027 filed on Jul. 19, 2002, including the specification, claims, accompanying drawings and abstract of the disclosure is incorporated herein by reference in its entirety.

While the present invention has been described with reference to the particular illustrative embodiments, it is not to be restricted by the embodiments. It is to be appreciated that those skilled in the art can change or modify the embodiments without departing from the scope and spirit of the present invention.

What is claimed is:

1. A frequency correction circuit for correcting a deviation in frequency of a signal generated from a clock signal obtained from an oscillator circuit, said oscillator circuit comprising an oscillator device for generating a reference clock signal, and first and second capacitive elements, each of the capacitive elements having one end connected across the oscillator device and another end grounded, said frequency correction circuit comprising:

a clock frequency divider for frequency-dividing the clock signal into a desired frequency, said clock frequency divider comprising a plurality of counters connected in cascade, each of said plurality of counters frequency-dividing the clock signal and supplying a frequency-divided output to successive one of said plurality of counters as a clock; and a correction controller for controlling said clock frequency divider;

said clock frequency divider further comprising a count adjuster for adjusting timing of counting carried out in response to the clock signal to cancel an error contained in the clock signal;

said correction controller comprising:

a time setting circuit for setting of first and second reference times and initializing said clock frequency divider;

a time generator for calculating a generation time corresponding to a sum of the first reference time supplied from said time setting circuit and a time from said clock frequency divider;

a time comparator for comparing the generation time with the second reference time; and a count controller operative in response to said time comparator for supplying said count adjuster with a control signal controlling said plurality of counters to delay or hasten a timing of counting.

2. The circuit in accordance with claim 1, wherein said correction controller measures a temperature of environment of a circuit to send a result to said time-base count controller along with the result of comparison.

3. The circuit in accordance with claim 1, wherein said time setting circuit includes a receiver for receiving the first and second reference times.

4. The circuit in accordance with claim 1, wherein said count adjuster includes a first canceller for receiving the clock signal and for canceling, for the predetermined time period, the clock signal to be supplied to first one of said plurality of counters responsive to a count delay control signal and the clock signal.

5. The circuit in accordance with claim 3, wherein said count adjuster includes a first canceller for receiving the clock signal and for canceling, for the predetermined time period, the clock signal to be supplied to first one of said plurality of counters responsive to a count delay control signal and the clock signal.

6. The circuit in accordance with claim 4, wherein said first canceller includes:
a first inverter for inverting a signal level of the count delay control signal; and
a first logical product operator for generating a logical product of an output of said first inverter and the clock signal;
said first logical product operator supplying the logical product as the clock for said first counter.

7. The circuit in accordance with claim 5, wherein said first canceller includes:
a first inverter for inverting a signal level of the count delay control signal; and
a first logical product operator for generating a logical product of an output of said first inverter and the clock signal;
said first logical product operator supplying the logical product as the clock for said first counter.

8. The circuit in accordance with claim 1, wherein said count adjuster includes a second canceller for canceling an input signal to said first counter for the predetermined time period in response to a count delay control signal and an output signal fed back from a first one of said plurality of counters.

9. The circuit in accordance with claim 3, wherein said count adjuster includes a second canceller for canceling an input signal to said first counter for the predetermined time period in response to a count delay control signal and an output signal fed back from first one of said plurality of counters.

10. The circuit in accordance with claim 8, wherein said second canceller includes a first logical operator for generating an inverted exclusive logical sum of the count delay control signal and an output signal fed back from said first counter to output the inverted exclusive logical sum as an input signal to said first counter.

11. The circuit in accordance with claim 9, wherein said second canceller includes a first logical operator for generating an inverted exclusive logical sum of the count delay control signal and an output signal fed back from said first counter to output the inverted exclusive logical sum as an input signal to said first counter.

12. The circuit in accordance with claim 1, wherein said count adjuster includes a third canceller for canceling the clock signal supplied to first one of said plurality of counters or the predetermined time period in response to a count lead control signal and the clock; and
a count lead section for advancing a phase of counting an input signal supplied to third one of said plurality of counters for the predetermined time period in response to an output signal from said first counter and a feedback output from second one of said plurality of counters.

13. The circuit in accordance with claim 3, wherein said count adjuster includes a third canceller for canceling the clock signal supplied to a first one of said plurality of counters for the predetermined time period in response to a count lead control signal and the clock; and
a count lead section for advancing a phase of counting an input signal supplied to third one of said plurality of counters for the predetermined time period in response to an output signal from said first counter and a feedback output from second one of said plurality of counters.

14. The circuit in accordance with claim 12, wherein said third canceller includes:
a second inverter for inverting a signal level of the count lead control signal; and
a second logical product operator for generating a logical product from an output of said second inverter and the clock signal to provide said first counter with the logical product generated;
said count lead section including:
a first inverting logical sum operator for generating an inverted logical sum of the count lead control signal and an output signal from said first counter; and
a second logical operator for generating an inverted exclusive logical sum of an output signal of said first inverting logical sum operator and an output signal fed back from said second counter to output the inverted exclusive logical sum as an input signal to said second counter;
said second counter operative in response to the clock signal and producing an output signal to one of said plurality of counters successive thereto as a clock for said successive counter.

15. The circuit in accordance with claim 13, wherein said third canceller includes:
a second inverter for inverting a signal level of the count lead control signal; and
a second logical product operator for generating a logical product from an output of said second inverter and the clock signal to provide said first counter with the logical product generated;
said count lead section including a first inverting logical sum operator for generating an inverted logical sum of the count lead control signal and an output signal from said first counter; and
a second logical operator for generating an inverted exclusive logical sum of an output signal of said first inverting logical sum operator and an output signal fed back from said second counter to output an inverted exclusive logical sum as an input signal to said second counter;
said second counter operative in response to the clock signal and producing an output signal to one of said plurality of counters successive thereto as a clock for said successive counter.

16. The circuit in accordance with claim 1, wherein said count adjuster comprising:

a level supplying section for supplying a same signal level as that of an output signal of a first one of said plurality of counters for the predetermined time period, in response to the lead control signal for a counting and an input signal fed back from said first inverting counter; and a count lead section for advancing a phase of counting an input signal supplied to third one of said plurality of counters, for the predetermined time period, using the output signal from said first counter and an output fed back from second one of said plurality of counters.

17. The circuit in accordance with claim 3, wherein said count adjuster comprising:

a level supplying section for supplying a same signal level as that of an output signal of a first one of said plurality of counters for the predetermined time period, in response to the lead control signal for a counting and an input signal fed back from said first counter; and a count lead section for advancing a phase of counting an input signal supplied to third one of said plurality of counters, for the predetermined time period, using the output signal from said first counter and an output fed back from second one of said plurality of counters.

18. The circuit in accordance with claim 16, wherein said level supplying section is operative in response to a third logical operator for generating an inverted exclusive logical sum of a count lead control signal and an input fed back from said first counter to output the inverted exclusive logical sum generated as an input signal to said first counter;

said count lead section including:
a first inverting logical sum operator for generating an inverted logical sum of the count lead control signal and an input fed back from said first counter; and
a second logical operator for generating an inverted exclusive logical sum of an output signal of said first logical sum operator and an output signal fed back from said second counter to output the inverted exclusive logical sum as an input signal to said second counter;
said second counter operative in response to the clock signal and producing an output signal to one of said plurality of counters successive thereto as a clock for said successive counter.

19. The circuit in accordance with claim 17, wherein said level supplying section is operative in response to a third logical operator for generating an inverted exclusive logical sum of a count lead control signal and an input fed back from said first counter to output the inverted exclusive logical sum generated as an input signal to said first counter;

said count lead section including:
a first inverting logical sum operator for generating an inverted logical sum of the count lead control signal and an input fed back from said first counter; and
a second logical operator for generating an inverted exclusive logical sum of an output signal of said first inverting logical sum operator and an output signal fed back from said second counter to output the inverted exclusive logical sum as an input signal to said second counter;
said second counter operative in response to the clock signal and producing an output signal to one of said plurality of counters successive thereto as a clock for said successive counter.

20. The circuit in accordance with claim 1, wherein said count adjuster includes:

a clock masking section responsive to a count delay control signal and a count lead control signal for masking the clock signal supplied to a first one of said plurality of counters;

a count lead section for advancing a phase in counting an input signal supplied to third one of said plurality of counters for the predetermined time period in response to a count lead control signal for second one of said plurality of counters, an output signal from said first counter, and an output fed back from said second counter; and a fourth canceller for supplying the clock signal to said second counter responsive to the count delay control signal and for canceling the clock signal for the predetermined time period.

21. The circuit in accordance with claim 3, wherein said count adjuster includes:

a clock masking section responsive to a count delay control signal and a count lead control signal for masking the clock signal supplied to a first one of said plurality of counters;

a count lead section for advancing a phase in counting an input signal supplied to third one of said plurality of counters for the predetermined time period in response to a count lead control signal for second one of said plurality of counters, an output signal from said first counter, and an output fed back from said second counter; and a fourth canceller for supplying the clock signal to said second counter responsive to the count delay control signal and for canceling the clock signal for the predetermined time period.

22. The circuit in accordance with claim 20, wherein said clock masking section includes:

a second inverting logical sum operator for generating an inverted logical sum of the count delay control signal and the count lead control signal; and a third logical product operator for generating a logical product of an output of said second inverting logical sum operator and the clock signal;

said count lead section including:
a first inverting logical sum operator for generating an inverted logical sum of the count lead control signal and an output signal from said first counter; and
a second logical operator for generating an inverted exclusive logical sum of an output signal from said first inverting logical sum operator and an output signal fed back from said second counter to output the inverted exclusive logical sum as an input signal to said second counter;
said fourth canceller including:
a third inverter for inverting a signal level of the count delay control signal; and
a third logical product operator for generating a logical product of an output of said third inverter and the clock signals;
said third logical product operator sending the logical product generated as a clock to said first counter.

23. The circuit in accordance with claim 21, wherein said clock masking section includes:

a second inverting logical sum operator for generating an inverted logical sum of the count delay control signal and the count lead control signal; and a third logical product operator for generating a logical product of an output of said second inverting logical sum operator and the clock signal;

said count lead section including:
a first inverting logical sum operator for generating an inverted logical sum of the count lead control signal and an output signal from said first counter; and
a second logical operator for generating an inverted exclusive logical sum of an output signal from said first inverting logical sum operator and an output signal fed back from said second counter to output the inverted exclusive logical sum as an input signal to said second counter;

said fourth canceller including:
a third inverter for inverting a signal level of the count delay control signal; and
a third logical product operator for generating a logical product of an output of said third inverter and the clock signals;
said third logical product operator sending the logical product generated as a clock to said first counter.

24. The circuit in accordance with claim 1, wherein said count adjuster includes:
a clock masking section for masking the clock signal supplied to a first one of said plurality of counters during a period defined by either one of a count delay control signal and a count lead control signal; and
a count hastening/delaying section operative in response to either one of the count delay control signal and the count lead control signal supplied to a second one of said plurality of counters for receiving one of an input signal hastening a start of the counting and an input signal delaying the start of the counting, respectively;
said first and second counters being operative in response to the clock signal as a clock.

25. The circuit in accordance with claim 3, wherein said count adjuster includes:
a clock masking section for masking the clock signal supplied to a first one of said plurality of counters during a period defined by either one of a count delay control signal and the count lead control signal; and
a count hastening/delaying section operative in response to either one of the count delay control signal and the count lead control signal supplied to a second one of said plurality of counters for receiving one of an input signal hastening a start of the counting and an input signal delaying the start of the counting, respectively;
said first and second counters being operative in response to the clock signal as a clock.

26. The circuit in accordance with claim 24, wherein said clock masking section includes:
a first logical sum operator for generating a logical sum of the count delay control signal and the count lead control signal; and
a fourth logical operator for generating an inverted exclusive logical product of an output of said first logical sum operator and an output fed back from said first counter to output the inverted exclusive logical product as an input signal to said first counter.

27. The circuit in accordance with claim 25, wherein said clock masking section includes:
a first logical sum operator for generating a logical sum of the count delay control signal and the count lead control signal; and
a fourth logical operator for generating an inverted exclusive logical product of an output of said first logical sum operator and an output fed back from said first counter to output the inverted exclusive logical product as an input signal to said first counter.

28. The circuit in accordance with claim 26, wherein said count hastening/delaying section includes:
a second inverting logical sum operator for generating an inverted logical sum of the count lead control signal and an output of said first counter;
a second logical sum operator for generating a logical sum of an output of said second inverting logical sum operator and the count delay control signal; and
a fifth logical operator for generating an inverted exclusive logical sum of an output of said second logical sum operator and an output fed back from said second counter to output the inverted exclusive logical sum as an input signal to said second counter.

29. The circuit in accordance with claim 27, wherein said count hastening/delaying section includes:
a second inverting logical sum operator for generating an inverted logical sum of the count lead control signal and an output of said first counter;
a second logical sum operator for generating a logical sum of an output of said second inverting logical sum operator and the count delay control signal; and
a fifth logical operator for generating an inverted exclusive logical sum of an output of said second logical sum operator and an output fed back from said second counter to output the inverted exclusive logical sum as an input signal to said second counter.

* * * * *